(12) United States Patent
Sugita

(10) Patent No.: US 7,853,077 B2
(45) Date of Patent: Dec. 14, 2010

(54) DATA COMPRESSION APPARATUS AND DATA COMPRESSION PROGRAM STORAGE MEDIUM

(75) Inventor: Yukio Sugita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1028 days.

(21) Appl. No.: 11/641,816

(22) Filed: Dec. 20, 2006

(65) Prior Publication Data

US 2007/0160287 A1   Jul. 12, 2007

(30) Foreign Application Priority Data

Dec. 26, 2005   (JP) .............................. 2005-371563

(51) Int. Cl.
*G06K 9/00* (2006.01)
*G06K 9/36* (2006.01)
*G06K 9/46* (2006.01)

(52) U.S. Cl. ........................................ 382/166; 382/239

(58) Field of Classification Search ....................... None
See application file for complete search history.

(56) References Cited

U.S. PATENT DOCUMENTS

| 6,611,620 | B1 * | 8/2003 | Kobayashi et al. ........... 382/166 |
| 6,983,074 | B1 * | 1/2006 | Clauson et al. ............. 382/244 |
| 7,183,950 | B2 * | 2/2007 | Sugita ..................... 341/76 |
| 7,212,676 | B2 * | 5/2007 | Dwyer et al. ............... 382/233 |
| 2006/0285756 | A1 * | 12/2006 | Sugita ..................... 382/232 |

FOREIGN PATENT DOCUMENTS

| JP | 01-093972 |   | 4/1989 |
| JP | 03-093359 |   | 4/1991 |
| JP | 5-328142 | A | 12/1993 |
| JP | 2000-156861 | A | 6/2000 |
| JP | 2002-236566 | A | 8/2002 |
| JP | 2005-277932 | A | 10/2005 |

* cited by examiner

*Primary Examiner*—Yuzhen Ge
(74) *Attorney, Agent, or Firm*—Sughrue Mion, PLLC

(57) ABSTRACT

A data compression apparatus has: first difference creating section that creates first difference data including a succession of numerical values representing differences between adjacent numerical values on numerical values constituting the color data; second difference creating section that creates second difference data including a succession of numerical values representing a difference between first difference data and another first difference data of respectively different color data; offset section that offsets the numerical values of individual difference data by a predetermined value; dividing section that divides the individual numerical values into upper order data comprising a succession of numerical values of the upper order unit bit portion and lower order data comprising a succession of numerical values of the lower order of unit bit portion; upper order data compression section and lower order data compression section that respectively apply reversible compression processing to the upper order data and the lower order data.

11 Claims, 20 Drawing Sheets

06 02 02 02 01 01 01 01 04 05 00 ———————— 00
⇩                                    └─────┬─────┘
                                      CONTINUITY OF
06 02 02 02 01 04 04 05 00 FF 7F        32767 PIECES

Fig. 11

| BEFORE CODING | AFTER CODING |
|---|---|
| A1 | 00 |
| A2 | 01 |
| A3 | 100 |
| A4 | 101 |
| A5 | 11000 |
| A6 | 11001 |
| A7 | 11101 |
| A8 | 11011 |
| A9 | 111000 |
| A10 | 111001 |
| A11 | 111010 |
| A12 | 111011 |
| A13 | 111100 |
| A14 | 111101 |
| A15 | 111110 |
| A16 | 111111 |

Fig. 14

| 1~50 | 51~100 | 101~150 | 151~200 | 201~256 |
|---|---|---|---|---|
| 0000000000000011, 2 | 0000000010001001, 10 | 0000000001011011, 10 | 0000000000010101, 10 | 0000000000100111, 10 |
| 0000000000000011, 3 | 0000000010001000, 10 | 0000000001011010, 10 | 0000000000010100, 10 | 0000000000100110, 10 |
| 0000000000000010, 3 | 0000000010001011, 10 | 0000000001000101, 10 | 0000000000010111, 10 | 0000000000100001, 10 |
| 0000000000001010, 4 | 0000000010001010, 10 | 0000000001000100, 10 | 0000000000010110, 10 | 0000000000100000, 10 |
| 0000000000001001, 4 | 0000000010110101, 10 | 0000000001000111, 10 | 0000000000010001, 10 | 0000000000100011, 10 |
| 0000000000001000, 4 | 0000000010110100, 10 | 0000000001000110, 10 | 0000000000010000, 10 | 0000000000100010, 10 |
| 0000000000010110, 5 | 0000000010110111, 10 | 0000000001000001, 10 | 0000000000010011, 10 | 0000000000101101, 10 |
| 0000000000001111, 6 | 0000000010110110, 10 | 0000000001000000, 10 | 0000000000010010, 10 | 0000000000101100, 10 |
| 0000000000011101, 7 | 0000000010110001, 10 | 0000000001000011, 10 | 0000000000011101, 10 | 0000000000101111, 10 |
| 0000000010111000, 8 | 0000000010110000, 10 | 0000000001000010, 10 | 0000000000011100, 10 | 0000000000101110, 10 |
| 0000000010111110, 8 | 0000000010110011, 10 | 0000000001001101, 10 | 0000000000011111, 10 | 0000000000101001, 10 |
| 0000000101111111, 8 | 0000000010110010, 10 | 0000000001001100, 10 | 0000000000011110, 10 | 0000000000101000, 10 |
| 0000000101111110, 9 | 0000000010111101, 10 | 0000000001001111, 10 | 0000000000011001, 10 | 0000000000101011, 10 |
| 0000000101111001, 9 | 0000000010111100, 10 | 0000000001001110, 10 | 0000000000011000, 10 | 0000000000101010, 10 |
| 0000000101111000, 9 | 0000000010111111, 10 | 0000000001001001, 10 | 0000000000011011, 10 | 0000000001010101, 10 |
| 0000000101111011, 9 | 0000000010111110, 10 | 0000000001001000, 10 | 0000000000011010, 10 | 0000000001010100, 10 |
| 0000000101111010, 9 | 0000000010111001, 10 | 0000000001001011, 10 | 0000000000000101, 10 | 0000000001010111, 10 |
| 0000000101110101, 9 | 0000000010111000, 10 | 0000000001001010, 10 | 0000000000000100, 10 | 0000000001010110, 10 |
| 0000000101110100, 9 | 0000000010111011, 10 | 0000000001110101, 10 | 0000000000000111, 10 | 0000000001010001, 10 |
| 0000000101110111, 9 | 0000000010111010, 10 | 0000000001110100, 10 | 0000000000000110, 10 | 0000000001010000, 10 |
| 0000000101110110, 9 | 0000000010100101, 10 | 0000000001110111, 10 | 0000000000000001, 10 | 0000000001010011, 10 |
| 0000000101110001, 9 | 0000000010100100, 10 | 0000000001110110, 10 | 0000000000000000, 10 | 0000000001010010, 10 |
| 0000000101110011, 9 | 0000000010100111, 10 | 0000000001110001, 10 | 0000000000000011, 10 | 0000000001011101, 10 |
| 0000000010010101, 10 | 0000000010100110, 10 | 0000000001110000, 10 | 0000000000000010, 10 | 0000000001011100, 10 |
| 0000000010010100, 10 | 0000000010100001, 10 | 0000000001110011, 10 | 0000000000000101, 10 | 0000000001011111, 10 |
| 0000000010010111, 10 | 0000000010100000, 10 | 0000000001110010, 10 | 0000000000001100, 10 | 0000000001011110, 10 |
| 0000000010010110, 10 | 0000000010100011, 10 | 0000000001111101, 10 | 0000000000001111, 10 | 0000000001011001, 10 |
| 0000000010010001, 10 | 0000000010100010, 10 | 0000000001111100, 10 | 0000000000001110, 10 | 0000000001011000, 10 |
| 0000000010010000, 10 | 0000000010101101, 10 | 0000000001111111, 10 | 0000000000001001, 10 | 0000000001011011, 10 |
| 0000000010010011, 10 | 0000000010101100, 10 | 0000000001111110, 10 | 0000000000001000, 10 | 0000000001011010, 10 |
| 0000000010010010, 10 | 0000000010101111, 10 | 0000000001111001, 10 | 0000000000001011, 10 | 0000000001000101, 10 |
| 0000000010011101, 10 | 0000000010101110, 10 | 0000000001111000, 10 | 0000000000001010, 10 | 0000000001000100, 10 |
| 0000000010011100, 10 | 0000000010101001, 10 | 0000000001111011, 10 | 0000000000110101, 10 | 0000000001000111, 10 |
| 0000000010011111, 10 | 0000000010101000, 10 | 0000000001111010, 10 | 0000000000110100, 10 | 0000000001000110, 10 |
| 0000000010011110, 10 | 0000000010101011, 10 | 0000000001100101, 10 | 0000000000110111, 10 | 0000000001000001, 10 |
| 0000000010011001, 10 | 0000000010101010, 10 | 0000000001100100, 10 | 0000000000110110, 10 | 0000000001000000, 10 |
| 0000000010011000, 10 | 0000000001010101, 10 | 0000000001100111, 10 | 0000000000110001, 10 | 0000000001000011, 10 |
| 0000000010011011, 10 | 0000000001010100, 10 | 0000000001100110, 10 | 0000000000110000, 10 | 0000000001000010, 10 |
| 0000000010011010, 10 | 0000000001010111, 10 | 0000000001100001, 10 | 0000000000110011, 10 | 0000000001001101, 10 |
| 0000000010000101, 10 | 0000000001010110, 10 | 0000000001100000, 10 | 0000000000110010, 10 | 0000000001001100, 10 |
| 0000000010000100, 10 | 0000000001010001, 10 | 0000000001100011, 10 | 0000000000111101, 10 | 0000000001001111, 10 |
| 0000000010000111, 10 | 0000000001010000, 10 | 0000000001100010, 10 | 0000000000111100, 10 | 0000000001001110, 10 |
| 0000000010000110, 10 | 0000000001010011, 10 | 0000000001101101, 10 | 0000000000111111, 10 | 0000000001001001, 10 |
| 0000000010000001, 10 | 0000000001010010, 10 | 0000000001101100, 10 | 0000000000111110, 10 | 0000000001001000, 10 |
| 0000000010000000, 10 | 0000000001011101, 10 | 0000000001101111, 10 | 0000000000111001, 10 | 0000000001001011, 10 |
| 0000000010000011, 10 | 0000000001011100, 10 | 0000000001101110, 10 | 0000000000111000, 10 | 0000000001001010, 10 |
| 0000000010000010, 10 | 0000000001011111, 10 | 0000000001101001, 10 | 0000000000111011, 10 | 0000000011100101, 10 |
| 0000000010001101, 10 | 0000000001011110, 10 | 0000000001101000, 10 | 0000000000111010, 10 | 0000000011100100, 10 |
| 0000000010001100, 10 | 0000000001011001, 10 | 0000000001101011, 10 | 0000000000100101, 10 | 0000000011100111, 10 |
| 0000000010001111, 10 | 0000000001011000, 10 | 0000000001101010, 10 | 0000000000100100, 10 | 0000000011100110, 10 |
| 0000000010001110, 10 | | | | 0000000011100001, 10 |
| | | | | 0000000011100000, 10 |
| | | | | 0000000011100011, 10 |
| | | | | 0000000011100010, 10 |
| | | | | 0000001011100101, 10 |
| | | | | 0000001011100100, 10 |

Fig. 16

| 1~50 | 51~100 | 101~150 | 151~200 | 201~256 |
|---|---|---|---|---|
| 0000000000000011, 2 | 0000000010001001, 10 | 0000000001011011, 10 | 0000000000010101, 10 | 0000000000100111, 10 |
| 0000000000000011, 3 | 0000000010001000, 10 | 0000000001011010, 10 | 0000000000010100, 10 | 0000000000100110, 10 |
| 0000000000000010, 3 | 0000000010001011, 10 | 0000000001000101, 10 | 0000000000010111, 10 | 0000000000100001, 10 |
| 0000000000001010, 4 | 0000000010001010, 10 | 0000000001000100, 10 | 0000000000010110, 10 | 0000000000100000, 10 |
| 0000000000001001, 4 | 0000000010100011, 10 | 0000000001000111, 10 | 0000000000010001, 10 | 0000000000100011, 10 |
| 0000000000001000, 4 | 0000000010110100, 10 | 0000000001000110, 10 | 0000000000010000, 10 | 0000000000100010, 10 |
| 0000000000010110, 5 | 0000000010110111, 10 | 0000000001000001, 10 | 0000000000010011, 10 | 0000000000101101, 10 |
| 0000000000001111, 6 | 0000000010110110, 10 | 0000000001000000, 10 | 0000000000010010, 10 | 0000000000101100, 10 |
| 0000000000011101, 7 | 0000000010110001, 10 | 0000000001000011, 10 | 0000000000011101, 10 | 0000000000101111, 10 |
| 0000000010111000, 8 | 0000000010110000, 10 | 0000000001000010, 10 | 0000000000011100, 10 | 0000000000101110, 10 |
| 0000000010111110, 8 | 0000000010110011, 10 | 0000000001001101, 10 | 0000000000011111, 10 | 0000000000101001, 10 |
| 0000000101111111, 9 | 0000000010110100, 10 | 0000000001001100, 10 | 0000000000011110, 10 | 0000000000101000, 10 |
| 0000000101111110, 9 | 0000000010111101, 10 | 0000000001001111, 10 | 0000000000011001, 10 | 0000000000101011, 10 |
| 0000000101111001, 9 | 0000000010111100, 10 | 0000000001001110, 10 | 0000000000011000, 10 | 0000000000101010, 10 |
| 0000000101111000, 9 | 0000000010111111, 10 | 0000000001001001, 10 | 0000000000011011, 10 | 0000000011010101, 10 |
| 0000000101111011, 9 | 0000000010111110, 10 | 0000000001001000, 10 | 0000000000011010, 10 | 0000000011010100, 10 |
| 0000000101111010, 9 | 0000000010111001, 10 | 0000000001001011, 10 | 0000000000000101, 10 | 0000000011010111, 10 |
| 0000000101111101, 9 | 0000000010111000, 10 | 0000000001001010, 10 | 0000000000000100, 10 | 0000000011010110, 10 |
| 0000000101110100, 9 | 0000000010111011, 10 | 0000000001110101, 10 | 0000000000000111, 10 | 0000000011010001, 10 |
| 0000000101110111, 9 | 0000000010111010, 10 | 0000000001110100, 10 | 0000000000000110, 10 | 0000000011010000, 10 |
| 0000000101110110, 9 | 0000000010100101, 10 | 0000000001110111, 10 | 0000000000000001, 10 | 0000000011010011, 10 |
| 0000000101110011, 9 | 0000000010100100, 10 | 0000000001110110, 10 | 0000000000000000, 10 | 0000000011010010, 10 |
| 0000000010010101, 10 | 0000000010100111, 10 | 0000000001110001, 10 | 0000000000000011, 10 | 0000000011011101, 10 |
| 0000000010010100, 10 | 0000000010100110, 10 | 0000000001110000, 10 | 0000000000000010, 10 | 0000000011011100, 10 |
| 0000000010010111, 10 | 0000000010100001, 10 | 0000000001110011, 10 | 0000000000001101, 10 | 0000000011011111, 10 |
| 0000000010010110, 10 | 0000000010100000, 10 | 0000000001110010, 10 | 0000000000001100, 10 | 0000000011011110, 10 |
| 0000000010010001, 10 | 0000000010100011, 10 | 0000000001111101, 10 | 0000000000001111, 10 | 0000000011011001, 10 |
| 0000000010010000, 10 | 0000000010100010, 10 | 0000000001111100, 10 | 0000000000001110, 10 | 0000000011011000, 10 |
| 0000000010010011, 10 | 0000000010101101, 10 | 0000000001111111, 10 | 0000000000001001, 10 | 0000000011011011, 10 |
| 0000000010010010, 10 | 0000000010101100, 10 | 0000000001111110, 10 | 0000000000001000, 10 | 0000000011011010, 10 |
| 0000000010011101, 10 | 0000000010101111, 10 | 0000000001111001, 10 | 0000000000001011, 10 | 0000000011000101, 10 |
| 0000000010011100, 10 | 0000000010101110, 10 | 0000000001111000, 10 | 0000000000001010, 10 | 0000000011000100, 10 |
| 0000000010011111, 10 | 0000000010101001, 10 | 0000000001111011, 10 | 0000000000110101, 10 | 0000000011000111, 10 |
| 0000000010011110, 10 | 0000000010101000, 10 | 0000000001111010, 10 | 0000000000110100, 10 | 0000000011000110, 10 |
| 0000000010011001, 10 | 0000000010101011, 10 | 0000000001100101, 10 | 0000000000110111, 10 | 0000000011000001, 10 |
| 0000000010011000, 10 | 0000000010101010, 10 | 0000000001100100, 10 | 0000000000110110, 10 | 0000000011000000, 10 |
| 0000000010011011, 10 | 0000000010010101, 10 | 0000000001100111, 10 | 0000000000110001, 10 | 0000000011000011, 10 |
| 0000000010011010, 10 | 0000000010010100, 10 | 0000000001100110, 10 | 0000000000110000, 10 | 0000000011000010, 10 |
| 0000000010000101, 10 | 0000000010010111, 10 | 0000000001100001, 10 | 0000000000110011, 10 | 0000000011001101, 10 |
| 0000000010000100, 10 | 0000000010010110, 10 | 0000000001100000, 10 | 0000000000110010, 10 | 0000000011001100, 10 |
| 0000000010000111, 10 | 0000000010010001, 10 | 0000000001100011, 10 | 0000000000111101, 10 | 0000000011001111, 10 |
| 0000000010000110, 10 | 0000000010010000, 10 | 0000000001100010, 10 | 0000000000111100, 10 | 0000000011001110, 10 |
| 0000000010000001, 10 | 0000000010010011, 10 | 0000000001101101, 10 | 0000000000111111, 10 | 0000000011001001, 10 |
| 0000000010000000, 10 | 0000000010010010, 10 | 0000000001101100, 10 | 0000000000111110, 10 | 0000000011001000, 10 |
| 0000000010000011, 10 | 0000000001011101, 10 | 0000000001101111, 10 | 0000000000111001, 10 | 0000000011001011, 10 |
| 0000000010000010, 10 | 0000000001011100, 10 | 0000000001101110, 10 | 0000000000111000, 10 | 0000000011001010, 10 |
| 0000000010001101, 10 | 0000000001011111, 10 | 0000000001101001, 10 | 0000000000111011, 10 | 0000000011100101, 10 |
| 0000000010001100, 10 | 0000000001011110, 10 | 0000000001101000, 10 | 0000000000111010, 10 | 0000000011100100, 10 |
| 0000000010001111, 10 | 0000000001011001, 10 | 0000000001101011, 10 | 0000000000100101, 10 | 0000000011100111, 10 |
| 0000000010001110, 10 | 0000000001011000, 10 | 0000000001101010, 10 | 0000000000100100, 10 | 0000000011100110, 10 |
|  |  |  |  | 0000000011100001, 10 |
|  |  |  |  | 0000000011100000, 10 |
|  |  |  |  | 0000000011100011, 10 |
|  |  |  |  | 0000000011100010, 10 |
|  |  |  |  | 0000001011100101, 10 |
|  |  |  |  | 0000001011100100, 10 |

Fig. 17

DATA COMPRESSION APPARATUS AND DATA COMPRESSION PROGRAM STORAGE MEDIUM

BACKGROUND OF THE INVENTION

1. Field of the Invention

The present invention relates to a data compression apparatus for compressing data such as image data, and a data compression program storage medium storing a data compression program, which causes an information processing apparatus such as a computer to operate as the data compression apparatus.

2. Description of the Related Art

Hitherto, in order to reduce storage capacity or traffic, there is widely adopted a technology of compressing data such as image data.

For example, Japanese Patent Laid Open Gazette TokuKai Hei.5-328142 discloses a technology as set forth below.

As to image data, data size is reduced in such a manner that an attribute plane of individual color, in which print set up information is recorded, is subjected to a reversible compression, and a plane of individual color of CMYK is non-reversible compression.

Japanese Patent Publication TokuKai No. 2002-236566 discloses a technology in which image data is compressed for each color plane, and individual color planes of the compressed image data are transferred to a printer every the block in order according to the size or the compressibility, so that the printer expands the transferred image data and forms a color image in accordance with the expanded image data.

Here, there will be explained a system to which a data compression technology is applied.

FIG. 1 is a view useful for understanding an example of a print system to which a data compression technology is applied. FIG. 2 is a view useful for understanding a data processing in the print system.

As shown in FIG. 1, the print system comprises a host controller 100, an interface equipment 200, and a printer 300. The host controller 100 is connected to the interface equipment 200 via an all-purpose interface cable 150 such as SCSI. And the interface equipment 200 is connected to the printer 300 via a dedicated interface cable 250.

In the host controller 100, as shown in FIG. 2, data 11 of images and characters described in various languages and formats, such as PDF, PS, TIFF, are divided into image (CT; Continuous Tone) data and characters and lines (LW; Line Work) data, and RIP (Raster Image Processing) is applied to such two types of data, so that bit map data 12A and 13A are created. Further, data compression processing is applied to such two types of data, so that non-reversible compression data 14 is created on the CT and reversible compression data 15 is created on the LW. Those types of compression data 14 and 15 are transmitted from the host controller 100 via the all-purpose interface cable 150 shown in FIG. 1 to the interface equipment 200. The interface equipment 200 applies a data expansion processing to the transmitted compression data 14 and 15 to creates bit map data 12B and 13B associated with the bit map data 12A and 13A, respectively, which are in the state before an application of the data compression processing by the host controller 100. With respect to the CT data, when the host controller 100 performs the data compression, the non-reversible compression processing is carried out. Accordingly, it is difficult to completely return the CI data after the data expansion, or the bit map data 12B to the CI data before the data compression, or the bit map data 12A. However, it is possible to reproduce the substantially same bit map data. With respect to the LW data, when the host controller 100 performs the data compression, the reversible compression processing is carried out. Accordingly, it is possible to restore the LW data after the data expansion, or the bit map data 13B to the LW data before the data compression, or the bit map data 13A.

The interface equipment 200 synthesizes the CI data after the data expansion or the bit map data 12B with the LW data after the data expansion or the bit map data 13B, and transmits the synthesized data to the printer 300 together with halftone dot information and the like in form of a tag. The printer 300 prints out an image in accordance with the bit map data received from the interface equipment 200 and the attached tag information.

In the event that there is a need that the host controller 100 and the interface equipment 200 are individually constructed in form of a separated apparatus, for example, in a case where the host controller 100 and the interface equipment 200 are mutually isolated, and in case of a system in which the interface equipment 200 receives image data from a plurality of host controllers, as shown in FIG. 2, there is provided such an arrangement that data is transferred to the interface equipment 200 through data compression by the host controller 100, so that the interface equipment 200 performs data expansion. This arrangement makes it possible to reduce a transfer time of the data from the host controller 100 to the interface equipment 200, and thereby improving the productivity of the print.

Generally, with respect to the CT data, there is adopted a compression system such as JPEG, which is high in compressibility, while it is non-reversible. On the other hand, with respect to the LW data, there is adopted a reversible compression system such as PackBits.

However, the compression system such as JPEG takes a lot of time for compression processing in software, and is a cause of the deterioration of the processing ability of the compression processing system in its entirety. Further, according to the compression system such as JPEG, the image quality might decrease when the compressibility is raised. When the compression processing is applied to the CT data representative of the image of the color, those problems become especially remarkable.

SUMMARY OF THE INVENTION

In view of the foregoing, it is an object of the present invention to provide a data compression apparatus capable of performing new and preferable data compression processing applicable to the compression of the CT data representative of the image of the color, and a data compression program storage medium storing a data compression program, which causes an information processing apparatus such as a computer to operate as the data compression apparatus capable of performing a data compression processing applicable to the compression of the CT data representative of the image of the color.

To achieve the above-mentioned object, the present invention provides a data compression apparatus that applies a data compression processing to data to be compressed, which consists of two or more color data represented by a succession of numerical values represented by a predetermined number of unit bits, in association with two or more sorts of color element, respectively, the data compression apparatus comprising:

a first difference creating section that determines differences between adjacent numerical values on a succession of numerical values constituting the individual color data, for the individual color data included in the compressed data, and creates a first difference data consisting of a succession of numerical values representative of the difference;

a second difference creating section that determines a difference between the first difference data of color data associated with a predetermined sort of color element of the color data included in the compressed data, and another first difference data of color data associated with another color elements excepting the predetermined sort of color element, and creates a second difference data consisting of a succession of numerical values representative of the difference;

an offset section that offsets the numerical values constituting individual difference data constituting a difference data group consisting of the first difference data of color data associated with the predetermined sort of color element and the second difference data of color data associated with said another color elements, by a predetermined value;

a dividing section that divides the individual numerical values offset in numerical value by the offset section into an upper order unit bit portion and a lower order unit bit portion at a predetermined number of divisional bits that is less than the predetermined number of unit bits, so that the individual difference data constituting the difference data group is divided into upper order data consisting of a succession of numerical values of the upper order unit bit portion and lower order data consisting of a succession of numerical values of the lower order of unit bit portion;

an upper order data compression section that applies reversible compression processing to the upper order data divided by the dividing section; and a lower order data compression section that applies the reversible compression processing to the lower order data divided by the dividing section.

Here, it is acceptable that the word "adjacent" of the expression "determines differences between adjacent numerical values" means the term "adjacent" on the data stream. However, it is not restricted to this interpretation. For example, in the event that the two-dimensional image data is treated as a one-dimensional stream-like shaped data, it is acceptable that the word "adjacent" means the term "adjacent" on the two-dimensional image. It is noted that "differences between adjacent numerical values" includes multidimensional differences not only one-dimensional difference, but also two or more-dimensional difference.

In the data compression apparatus according to the present invention as mentioned above, it is preferable that the first difference creating section determines a two-dimensional difference based on a plurality of numerical values each adjacent to an associated numerical value in a plurality of directions looking on an image, on the numerical values constituting the first difference data.

In the data compression apparatus according to the present invention as mentioned above, it is preferable that the upper order data compression section comprises a first coding section that performs such coding processing that numerical values excepting one or a plurality of predetermined compression subject numerical values of the upper order data are directly outputted without any processing, and compression subject numerical values are encoded into the compression subject numerical values and numerical values indicative of a continued number of the same compression subject numerical values as the compression subject numerical values.

In the data compression apparatus according to the present invention as mentioned above, it is preferable that the upper order data compression section comprises:

a first coding section that performs such coding processing that numerical values excepting one or a plurality of predetermined compression subject numerical values of the upper order data are directly outputted without any processing, and compression subject numerical values are encoded into the compression subject numerical values and numerical values indicative of a continued number of the same compression subject numerical values as the compression subject numerical values, and a second coding section that applies entropy coding to data subjected to coding by the first coding section using a table for associating codes with numerical values.

In the data compression apparatus according to the present invention as mentioned above, it is acceptable that the upper order data compression section comprises:

a first coding section that performs such coding processing that numerical values excepting one or a plurality of predetermined compression subject numerical values of the upper order data are directly outputted without any processing, and compression subject numerical values are encoded into the compression subject numerical values and numerical values indicative of a continued number of the same compression subject numerical values as the compression subject numerical values, and a second coding section that applies Huffman coding to data subjected to coding by the first coding section using a Huffman table.

In the data compression apparatus according to the present invention as mentioned above, it is preferable that the upper order data compression section comprises:

a first coding section that performs such coding processing that numerical values excepting one or a plurality of predetermined compression subject numerical values of the upper order data are directly outputted without any processing, and compression subject numerical values are encoded into the compression subject numerical values and numerical values indicative of a continued number of the same compression subject numerical values as the compression subject numerical values;

a histogram computing section that determines a histogram of numerical values appearing on data subjected to coding by the first coding section;

a code allocating section that allocates shorter codes in code length as higher numerical values in frequency of occurrence to a table for associating codes with numerical values in accordance with the histogram determined in the histogram computing section; and a second coding section that applies entropy coding to data subjected to coding by the first coding section using the table subjected to a code allocation by the code allocating section.

In the data compression apparatus according to the present invention as mentioned above, it is preferable that the histogram computing section performs a thinning for numerical values appearing on data subjected to coding by the first coding section and determines the histogram according to the thinned numerical values.

In the data compression apparatus according to the present invention as mentioned above, it is preferable that the lower order data compression section applies entropy coding to the lower order data using a table for associating codes with numerical values.

In the data compression apparatus according to the present invention as mentioned above, it is acceptable that the lower order data compression section applies Huffman coding to the lower order data using a Huffman table.

In the data compression apparatus according to the present invention as mentioned above, it is preferable that the lower order data compression section outputs the lower order data with non-compression in accordance with an instruction of compression omission.

To achieve the above-mentioned object, the present invention provides a data compression program storage medium storing a data compression program, which causes an information processing apparatus to operate as a data compression apparatus that applies a data compression processing to data to be compressed, which consists of two or more color data represented by a succession of numerical values represented by a predetermined number of unit bits, in association with two or more sorts of color element, respectively, the data compression apparatus comprising:

a first difference creating section that determines differences between adjacent numerical values on a succession of numerical values constituting the individual color data, for the individual color data included in the compressed data, and creates a first difference data consisting of a succession of numerical values representative of the difference;

a second difference creating section that determines a difference between the first difference data of color data associated with a predetermined sort of color element of the color data included in the compressed data, and another first difference data of color data associated with another color elements excepting the predetermined sort of color element, and creates a second difference data consisting of a succession of numerical values representative of the difference;

an offset section that offsets the numerical values constituting individual difference data constituting a difference data group consisting of the first difference data of color data associated with the predetermined sort of color element and the second difference data of color data associated with said another color elements, by a predetermined value;

a dividing section that divides the individual numerical values offset in numerical value by the offset section into an upper order unit bit portion and a lower order unit bit portion at a predetermined number of divisional bits that is less than the predetermined number of unit bits, so that the individual difference data constituting the difference data group is divided into upper order data consisting of a succession of numerical values of the upper order unit bit portion and lower order data consisting of a succession of numerical values of the lower order of unit bit portion;

an upper order data compression section that applies reversible compression processing to the upper order data divided by the dividing section; and a lower order data compression section that applies the reversible compression processing to the lower order data divided by the dividing section.

With respect to the data compression program storage medium of the present invention, only the basic aspects are disclosed here. It is noted, however, that the data compression program storage medium of the present invention include not only the basic aspects, but also various aspects corresponding to the above-mentioned aspects of the data compression apparatus.

With respect to the structural elements such as the offset section constituting the data compression program related to the present invention, it is acceptable that function of one structural element is implemented by one program part, function of one structural element is implemented by a plurality of program parts, or alternatively functions of a plurality structural elements are implemented by one program part. Further, it is acceptable that those structural elements are executed by oneself or by instruction to another program or program parts incorporated into a computer.

BRIEF DESCRIPTION OF THE DRAWINGS

FIG. 11 is a view useful for understanding coding in the run length coding section 551 shown in FIG. 3.

FIG. 14 is a view useful for understanding an association between codes and numerical values in the Huffman table.

FIG. 16 is a view useful for understanding an example of code trains prepared on the Huffman table.

FIG. 17 is a view useful for understanding an example of code trains prepared on the Huffman table.

DETAILED DESCRIPTION OF PREFERRED EMBODIMENTS

Embodiments of the present invention will be described with reference to the accompanying drawings.

Figure 1:
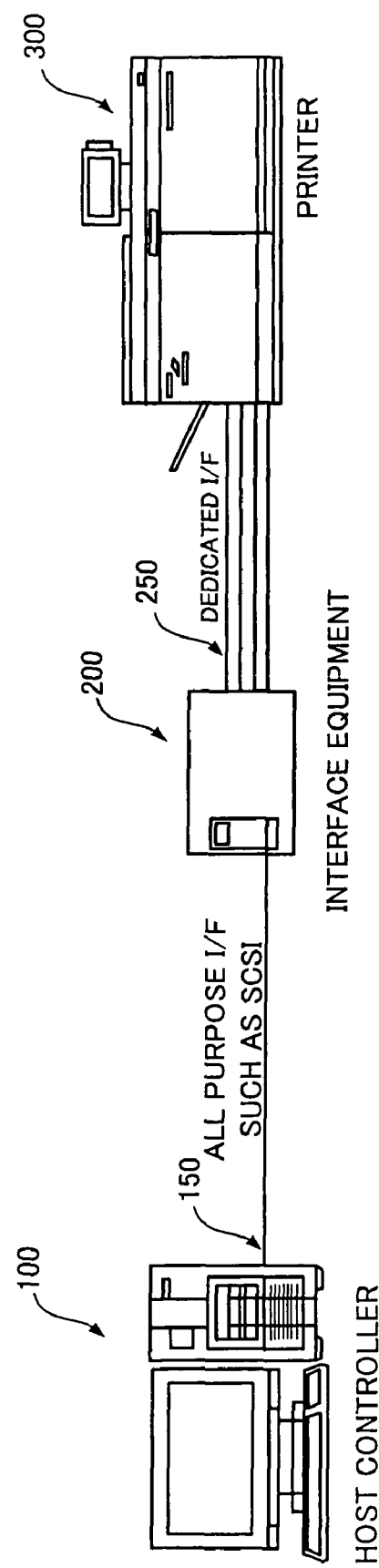
FIG. 1 is a view useful for understanding an example of a print system to which a data compression technology is applied.

The embodiments of the present invention relate to an image compression apparatus that is to be incorporated into the host controller 100 of the overall system shown in FIG. 1. More specifically, the image compression apparatus performs a data compression for bit map data 12A (FIG. 2) of CT in the host controller. Accordingly, it is understood that the data compression processing on the CT data, which were explained referring to FIG. 1 and FIG. 2, are replaced by a data compression processing according to the embodiments of the present invention, which will be explained herein after, and also the data expansion (thawing) processing in an interface equipment is replaced by the data expansion (thawing) processing associated with the data compression processing according to the embodiments of the present invention, and thus the redundant explanations on the overall system shown in FIG. 1 and the flow of the processing shown in FIG. 2 will be omitted.

Figure 3:
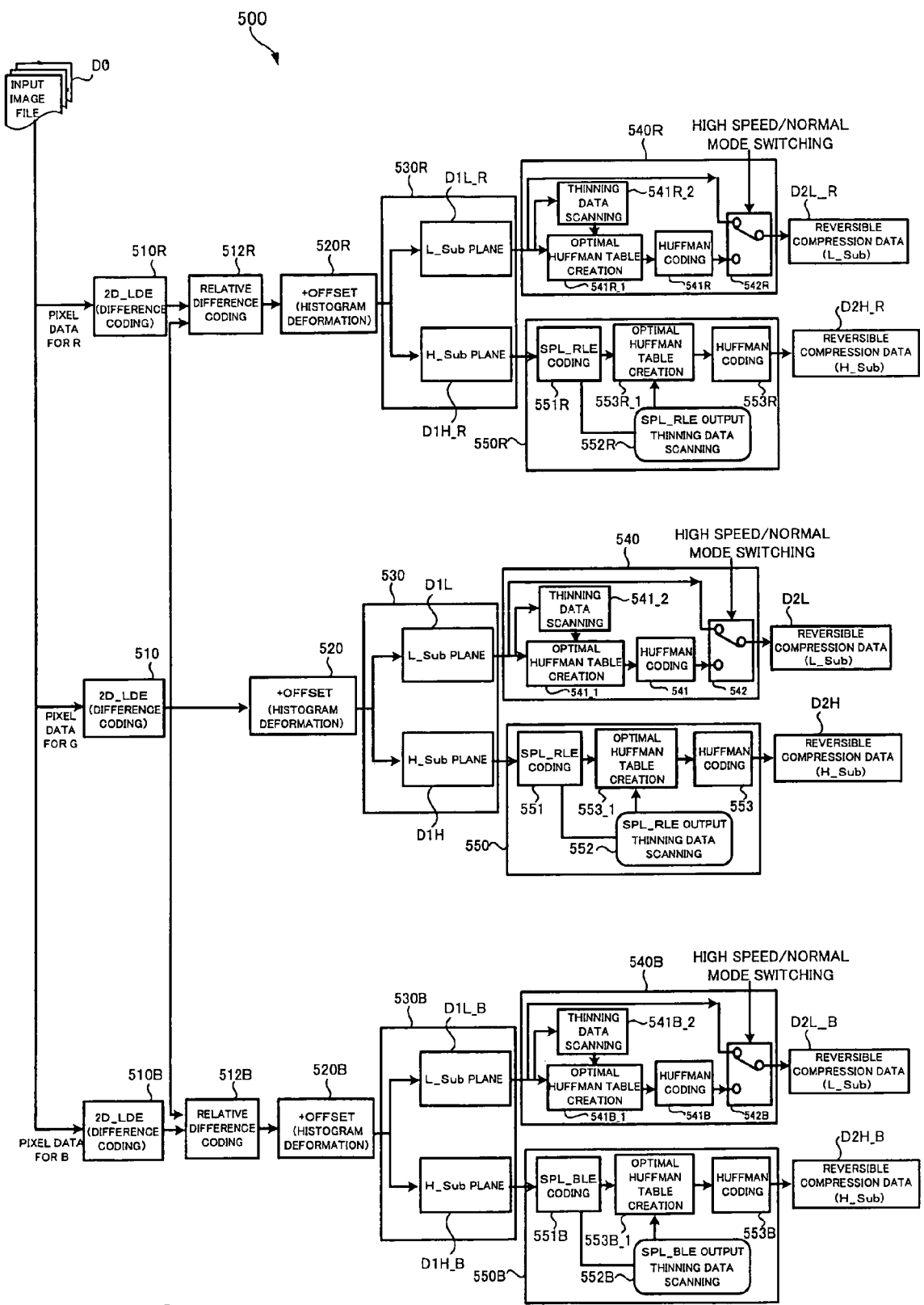
FIG. 3 is a block diagram of an image compression apparatus corresponding to an embodiment of a data compression apparatus of the present invention.

FIG. 3 is a block diagram of an image compression apparatus corresponding to an embodiment of a data compression apparatus of the present invention.

An data compression apparatus 500 shown in FIG. 3 is an image compression apparatus wherein a reversible compression processing is applied to both the CT data and the LW data for each color of red (R), green (G), and blue (B). The data compression apparatus 500 comprises relative differential coding sections 512R and 512B, two-dimensional differential coding sections 510, 510R, and 510B, offset sections 520, 520R, and 520B, plane division sections 530, 530R, and 530B, L-plane compression sections 540, 540R, and 540B, and H-plane compression sections 550, 550R, and 550B. Details of the respective sections 505 to 560 will be described later. Hereinafter, a flow of image data in the data compression apparatus 500 will be described.

Figure 2:
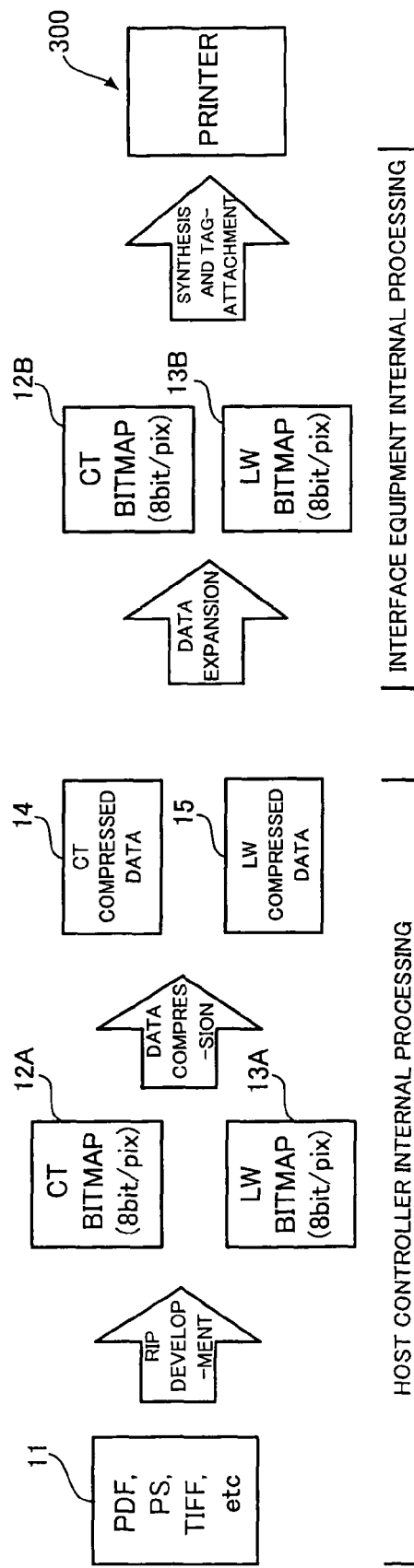
FIG. 2 is a view useful for understanding a data processing in the print system.

An input image file D0 (according to the present embodiment, it corresponds to a file for storing the CT data 12A, which is developed into a bit map, as shown in FIG. 2), is resolved into image data for each color of red (R), green (G), and blue (B), and then fed to the two-dimensional differential coding sections 510R, 510, and 510B, respectively. The two-dimensional differential coding sections 510R, 510, and 510B apply two-dimensional differential coding processing to the entered data, that is, processing that as to the continuousness of the numerical values that composes data, there are determined two-dimensional differences based on two or more numerical values adjacent to the associated numerical value in directions of the plural seen on the image, so that image data consisting of the continuousness of 8 bits of numerical values, which represents the difference, is generated.

In the following, there will be explained the processing of image data of red (R), green (G), and blue (B) after being subjected to such the two-dimensional difference coding processing. Here, it first explains the processing of the image data of green (G), and next, it explains the processing of the image data of each color of red (R) and blue (B).

The image data of green (G), which is subjected to the two-dimensional difference coding processing, is fed to the offset section 520 so as to be added with a predetermined offset value. The plane division section 530 divides 8 bits of numerical value of the image data after the offset into 4 bits in the lower order of unit bit and 4 bits in the upper order of unit bit, so that the image data is divided into a lower order sub-plane D1L consisting of a succession of numerical values of 4 bits in the lower order of unit bit and an upper order sub-plane D1H consisting of a succession of numerical values of 4 bits in the upper order of unit bit. The lower order sub-plane D1L and the upper order sub-plane D1H, which are divided by the plane division section 530, are fed to the L-plane compression section 540 and the H-plane compression section 550, respectively, so as to be subjected to the reversible compression.

The L-plane compression section 540 comprises a thinning data scanning section 541_2, an optimal Huffman table creating section 541_1, a Huffman coding section 541, and a mode switching section 542. The lower order sub-plane D1L of the image data of green (G), which is fed to the L-plane compression section 540, is inputted to the thinning data scanning section 541_2 the optimal Huffman table creating section 541_1. The thinning data scanning section 541_2 performs thinning of data from the entered lower order sub-plane D1L, and the thinned data is scanned to analyze occurrence frequency (histogram) of numerical values constituting data. The analysis result is fed to the optimal Huffman table creating section 541_1. The optimal Huffman table creating section 541_1 creates, in accordance with the analysis result, Huffman table in which the higher numerical values in occurrence frequency, of the numerical values of lower order sub-plane D1L of the image data of green (G), are associated with codes represented by the shorter bit length. The Huffman coding section 541 performs processing in which numerical values constituting the lower order sub-plane D1L are encoded in accordance with the created Huffman table (the Huffman coding). The Huffman coding section 541 attaches compression information including an allocation table for numerical values and codes to data subjected to the Huffman coding processing. The Huffman coding is a sort of the entropy coding. The L-plane compression section 540 incorporates therein a mode switching section 542. The mode switching section 542 switches modes between a normal mode involving the Huffman coding by the Huffman coding section 541 and a high speed mode omitting the Huffman coding and directly outputting the lower order sub-plane D1L, in accordance with a user's instruction of the high speed mode and the normal mode. The L-plane compression section 540 outputs lower order compressed data D2L in which the lower order sub-plane D1L is compressed. In case of the high speed mode, however, the lower order compressed data D2L is the lower order sub-plane D1L.

On the other hand, the H-plane compression section 550 comprises a run length coding section 551, a thinning data scanning section 552, an optimal Huffman table creating section 553_1 and a Huffman coding section 553. The upper order sub-plane D1H is fed to the run length coding section 551.

The run length coding section 551 detects, first, the presence of one or a plurality of compression object numerical values from among the entered upper order sub-plane D1H, and the continued number of the same compression object numerical values. Next, the run length coding section 551 performs such coding processing (a so-called run length coding processing) that numerical values excepting the compression object numerical values of the upper order sub-plane D1H are directly outputted without any processing, and the compression object numerical values are encoded into the compression object numerical values and numerical values indicative of the continued number of the same compression object numerical values as the compression object numerical values. In order to perform the coding processing, according to the run length coding section 551, there is performed coding of expressing the continued number with a different bit number in accordance with the continued number of the same compression object numerical values. More specifically, for example, the coding is performed in such a manner that in the event that the continued number of the same compression object numerical values is a predetermined number or less, the continued number is expressed by one-unit bit number, and in the event that the continued number of the same compression object numerical values exceeds the predetermined number, the continued number is expressed by two-unit bit number. Data after coding by the run length coding section 551 is subjected to the Huffman coding processing by the thinning data scanning section 552, the optimal Huffman table creating section 553_1 and the Huffman coding section 553. The Huffman coding processing is similar to the above-mentioned lower order sub-plane D1L except that the data before the Huffman encoding processing is data after the run length encoding. And, the upper order sub-plane D1H, which is subjected to the run length encoding and the Huffman encoding, is finally output from an H plane compression section 550 as the upper order compression data D2H.

The above-mentioned description is concerned with the explanation of the processing of image data of green (G). Next, there will be explained the processing of the image data of each color of red (R) and blue (B). There will be explained the processing of the image data of red (R) first.

With respect to the image data of red (R), which is subjected to the two-dimensional differential coding processing, the relative differential coding section 512R computes a relative difference between it and the above mentioned image data of green (G) after the two-dimensional differential coding processing, and the image data of red (R) becomes data that consists of the continuousness of 8 bits of numerical value, which represents a relative difference to the two-dimensional differential data of green (G). The offset section 520R applies the offset to the image data of red (R) subjected to the relative differential coding processing. The plane division section 530R divides the image data of red (R) subjected to the offset into lower order sub-plane D1L_R of image data of red (R), which consists of the continuousness of the lower order bits of numerical value, and upper order sub-plane D1H_R of image data of red (R), which consists of the continuousness of the upper order bits of numerical value. The lower order sub-plane D1L_R of image data of red (R) is fed to the L-plane compression section 540R. The L-plane compression section 540R applies to that the reversible compression processing which is the same as the processing applied to the lower order sub-plane D1L of image data of green (G), and outputs the thus processed lower order sub-plane D1L_R of image data of red (R) in form of the lower order compression data D2L_R of red (R). On the other hand, the upper order sub-plane D1H_R of image data of red (R) is fed to the H-plane compression section 550R. The H-plane compression section 550R applies to that the reversible compression processing which is the same as the processing applied to the upper order sub-plane D1H of image data of green (G), and outputs the thus processed upper order sub-plane D1H_R of image data of red (R) in form of the upper order compression data D2H_R of red (R).

The above-mentioned description is concerned with the explanation for the processing of the image data of red (R), which is subjected to the two-dimensional differential coding processing.

With respect to the image data of blue (B), which is subjected to the two-dimensional differential coding processing, the relative differential coding section 512B converts it into a relative difference data with the two-dimensional differential data of green (G) in a similar fashion to that of the image data of red (R). The offset section 520B, the plane division section 530B, the L-plane compression section 540B, and the H-plane compression section 550B applies to the converted relative difference data the reversible compression processing similar to the processing applied to the image data of red (R). Thus, the L-plane compression section 540B, and the H-plane compression section 550B output the processed data in form of the lower order compression data D2L_B of blue (B) and the upper order compression data D2H_B of blue (B), respectively.

Thus, with respect to individual colors of red (R), green (G) and blue (B), the L-plane compression section and the H-plane compression section output the lower order compression data and the upper order compression data, respectively. As a result, three sets in all of the lower order compression data and the upper order compression data of these three colors are generated, and these three sets of data become the compression data of former image data. Thus obtained compression data is transmitted to the interface equipment 200 via the general-purpose interface 150 such as SCSI shown in FIG. 1. In interface equipment 200, the data extension processing is applied to the received reversible compression data. When the data extension processing is carried out, the decoding processing associated with various encoding processing explained in FIG. 3 is applied so that the same image data as the image data of the former input image file are restored.

The combination of the two-dimensional differential coding sections 510, 510R, and 510B corresponds to an example of the first difference creating section referred to in the present invention. The combination of the relative differential coding sections 512R and 512B corresponds to an example of the second difference creating section referred to in the present invention. The combination of the offset sections 520, 520R, and 520B corresponds to an example of the offset section referred to in the present invention. The combination of the plane division sections 530, 530R, and 530B corresponds to an example of the division section referred to in the present invention. The lower order sub-planes D1L, D1L_R and D1L_B correspond to an example of the lower order referred to in the present invention. The upper order sub-planes D1H, D1H_R and D1H_B correspond to an example of the upper order referred to in the present invention. The combination of the L-plane compression sections 540, 540R, and 540B corresponds to an example of the lower order data compression section referred to in the present invention. The combination of the H-plane compression sections 550, 550R, and 550B corresponds to an example of the upper order data compression section referred to in the present invention.

The combination of the run length coding sections 551, 551R, and 551B corresponds to an example of the first coding section referred to in the present invention. The combination of the thinning data scanning sections 552, 552R, and 552B corresponds to an example of the histogram computing section referred to in the present invention. The combination of the optimal Huffman table creating sections 553_1, 553R_1, and 553B_1 corresponds to an example of the code allocation section referred to in the present invention. The combination of the Huffman coding sections 553, 553R, and 553B corresponds to an example of the second coding section referred to in the present invention.

Figure 4:
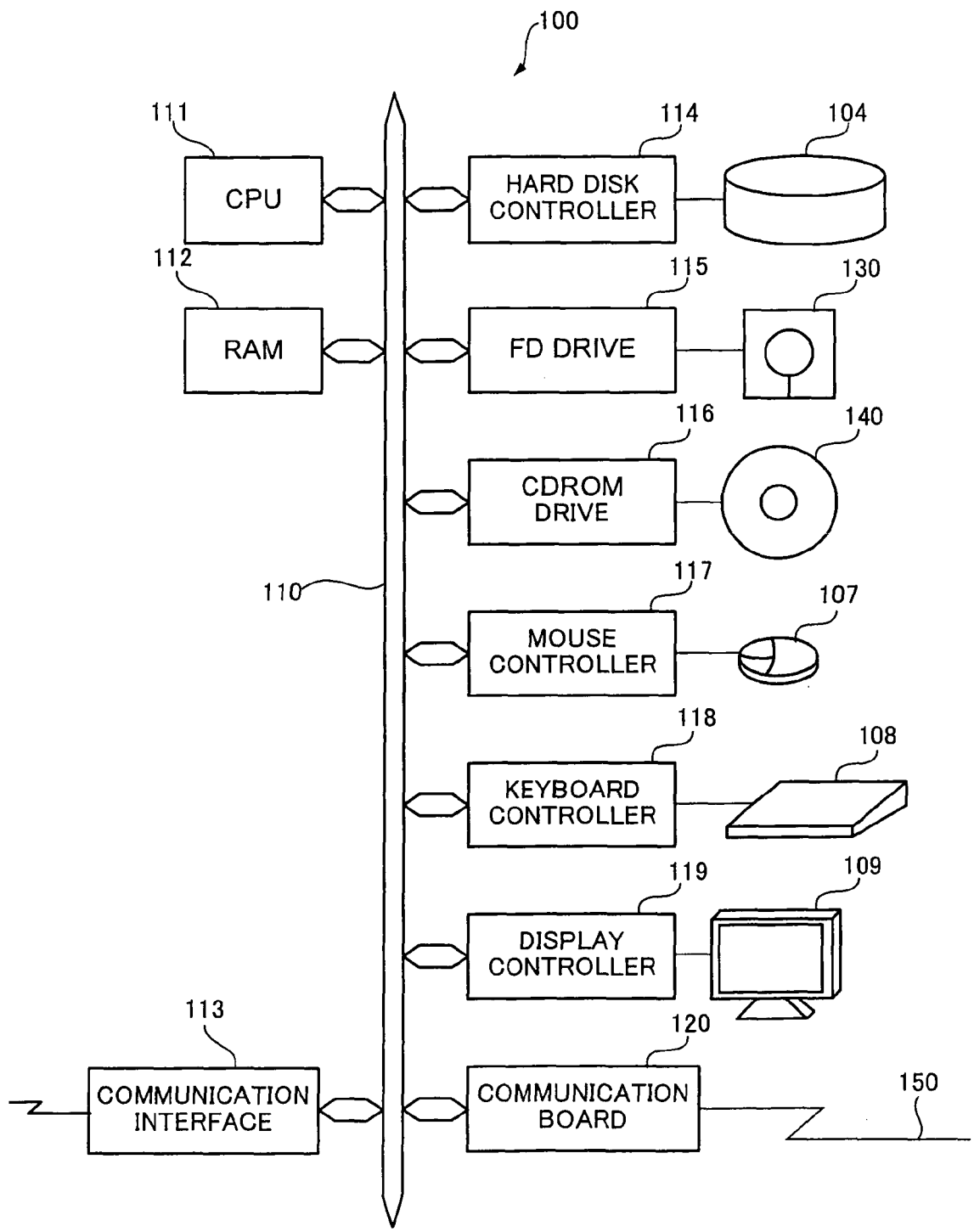
FIG. 4 is a hardware structural view of the host controller shown in FIG. 1.

FIG. 4 is a hardware structural view of the host controller shown in FIG. 1.

A host controller 100 shown in FIG. 1 may be constructed of a computer system of the structure shown in FIG. 4.

The host controller 100, which is constructed of the computer system shown in FIG. 4, comprises a CPU 111, a RAM 112, a communication interface 113, a hard disk controller 114, a flexible disk (FD) drive 115, a CD-ROM drive 116, a mouse controller 117, a keyboard controller 118, a display controller 119, and a communication board 120. These various types of elements are connected via a bus 110 to one another.

The hard disk controller 114 controls an access of a hard disk 104 that is incorporated in the host controller 100. The FD drive 115 and the CD-ROM drive 116 control an access of a flexible disk (FD) 130 and a CD-ROM 140, which are detachably mounted on the host controller 100, respectively. The mouse controller 117 and the keyboard controller 118 serve to detect operations of a mouse 107 and a keyboard 108, respectively, so that a result of the detection is transmitted to the CPU 111. The display controller 119 causes an image to be displayed on a display screen of a display 109 of the host controller 100 in accordance with the instruction of the CPU 111.

The communication board 120 has a function of a communication based on an all-purpose interface protocol such as SCSI, and serves to transmit the compressed image data via the interface cable 150 to the interface equipment 200.

The communication interface 113 serves to perform a communication via all-purpose network such as Internet. The host controller 100 receives image data via the communication interface 113.

The RAM 112 reads a program stored in the hard disk 104 to develop the program for the purpose of execution by the CPU 111. The CPU 111 reads the program developed in the RAM 112 and executes the same.

Figure 5:
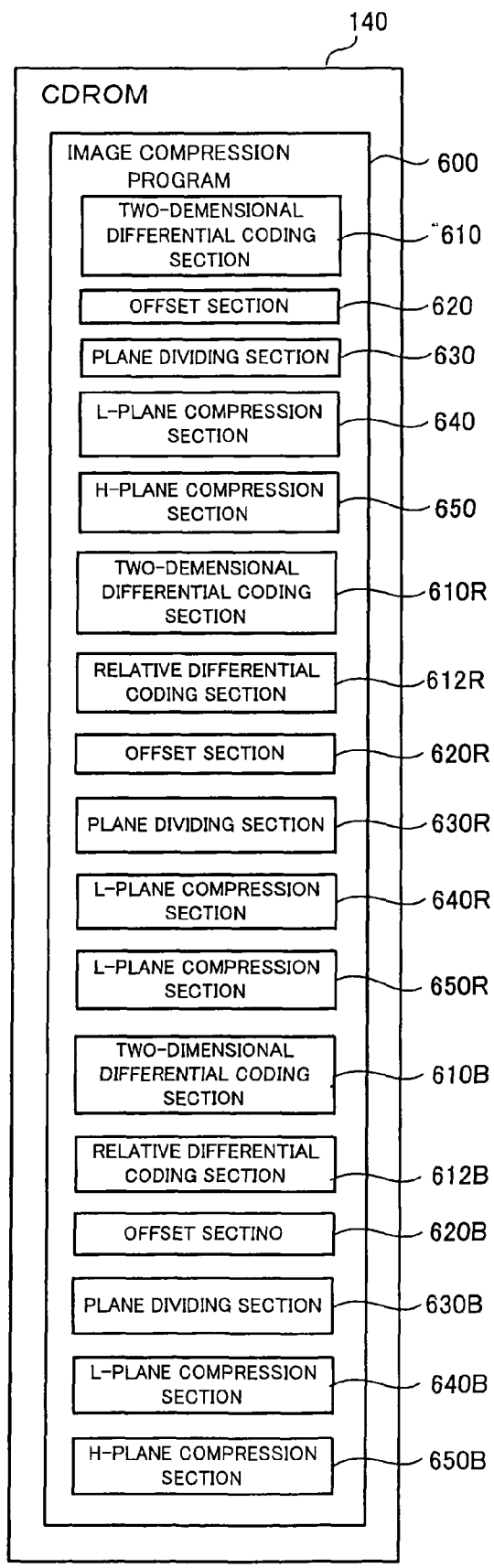
FIG. 5 is a typical structural view of an image compression program corresponding to an embodiment of a data compression program stored in a data compression program storage medium of the present invention.

FIG. 5 is a typical structural view of an image compression program corresponding to an embodiment of a data compression program stored in a data compression program storage medium of the present invention.

An image compression program 600 is stored in the CD-ROM 140.

The image compression program 600 comprises two-dimensional differential coding sections 610, 610R, and 610B, relative differential coding sections 612R and 612B, offset sections 620, 620R, and 620B, plane division sections 630, 630R, and 630B, L-plane compression sections 640, 640R, and 640B, and H-plane compression sections 650, 650R, and 650B. The CD-ROM 140 stores therein various sorts of programs for executing a series of processing in the host controller 100 shown in FIG. 1, as well as the data compression program 600. Those programs are the same as the conventional one, and thus the redundant explanation will be omitted.

When the CD-ROM 140 shown in FIG. 5 is mounted on the host controller 100 shown in FIG. 4 so as to be accessed by the CD-ROM drive 116, the programs stored in the CD-ROM 140 is up-loaded on the host controller 100 and is stored in the hard disk 104. Thus, the program stored in the hard disk 104 is read from the hard disk 104 and is developed in the RAM 112. When the CPU 111 executes the developed program, the host controller 100 operates as an apparatus for executing various sorts of processing as the host controller, including processing as the data compression apparatus 500 shown in FIG. 3.

Here, when the image compression program 600 shown in FIG. 5 is installed in the host controller 100 and is executed in the CPU 111, the image compression program 600 implements the data compression apparatus 500 shown in FIG. 3 in the host controller 100. When the CPU 111 executes the two-dimensional differential coding sections 610, 610R, and 610B, the relative differential coding sections 612R and 612B, the offset sections 620, 620R, and 620B, the plane division sections 630, 630R, and 630B, L-plane compression sections 640, 640R, and 640B, and the H-plane compression sections 650, 650R, and 650B, those sections serve as program parts that cause the host controller 100 to operate as the two-dimensional differential coding sections 510, 510R, and 510B, the relative differential coding sections 512R and 512B, the offset sections 520, 520R, and 520B, the plane division sections 530, 530R, and 530B, the L-plane compression sections 540, 540R, and 540B, and the H-plane compression sections 550, 550R, and 550B, respectively, which constitute the data compression apparatus 500 shown in FIG. 3. That is, those program parts substantially construct the structural elements of the on data compression apparatus 500 on the host controller 100.

Functions of the above mentioned individual sections that constitute the image compression program 600 shown in FIG. 5, wherein those individual sections are executed in the CPU 111, are the completely same as functions of the above mentioned individual sections that constitute the data compression apparatus 500 shown in FIG. 3, respectively. Accordingly, the above-mentioned explanation as to the individual sections of the data compression apparatus 500 shown in FIG. 3 and the detailed explanation, which will be described later, may serve as the explanation for the individual sections that constitute the image compression program 600 shown in FIG. 5.

Figure 6:
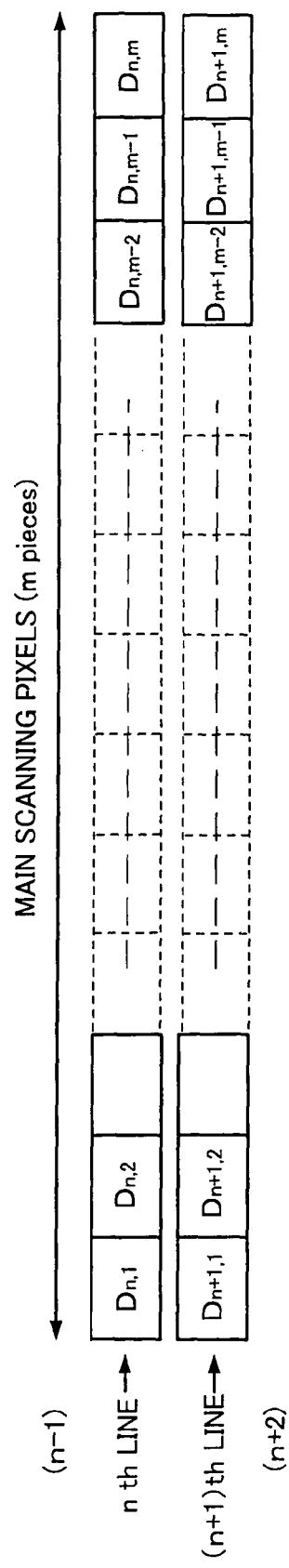
FIG. 6 is a view useful for understanding a data structure of image data on individual colors of red (R), green (G), and blue (B), of an input image file to be entered into the data compression apparatus 500 shown in FIG. 3.

FIG. 6 is a view useful for understanding a data structure of image data on individual colors of red (R), green (G), and blue (B), of an input image file to be entered into the data compression apparatus 500 shown in FIG. 3.

As shown in FIG. 6, the image data of individual colors of red (R), green (G), and blue (B), which is to be entered to the data compression apparatus 500 shown in FIG. 3, has a structure in which m pieces of pixels corresponding to the respective associated colors are arranged in a predetermined main scanning direction. With respect to nth line in a sub-scanning direction, which is perpendicular to the main scanning direction, pixel values of individual pixels arranged in the main scanning direction are expressed as follows.

$$D_{n,1}, D_{n,2}, \ldots, D_{n,m-2}, D_{n,m-1}, D_{n,m}$$

Likely, with respect to (n+1)th line in the sub-scanning direction, pixel values of individual pixels arranged in the main scanning direction are expressed as follows.

$$D_{n+1,1}, D_{n+1,2}, \ldots, D_{n+1,m-2}, D_{n+1,m-1}, D_{n+1,m}$$

The two-dimensional differential coding sections 510, 510R, and 510B, which constitute the data compression apparatus 500 shown in FIG. 3, receive for each color the image data having the structure as mentioned above so as to be subjected to the two-dimensional differential coding processing, and determine differences in the sub-scanning direction as to differences between the adjacent pixels in the main scanning direction.

Next, there will be explained the two-dimensional differential coding processing.

Figure 7B:
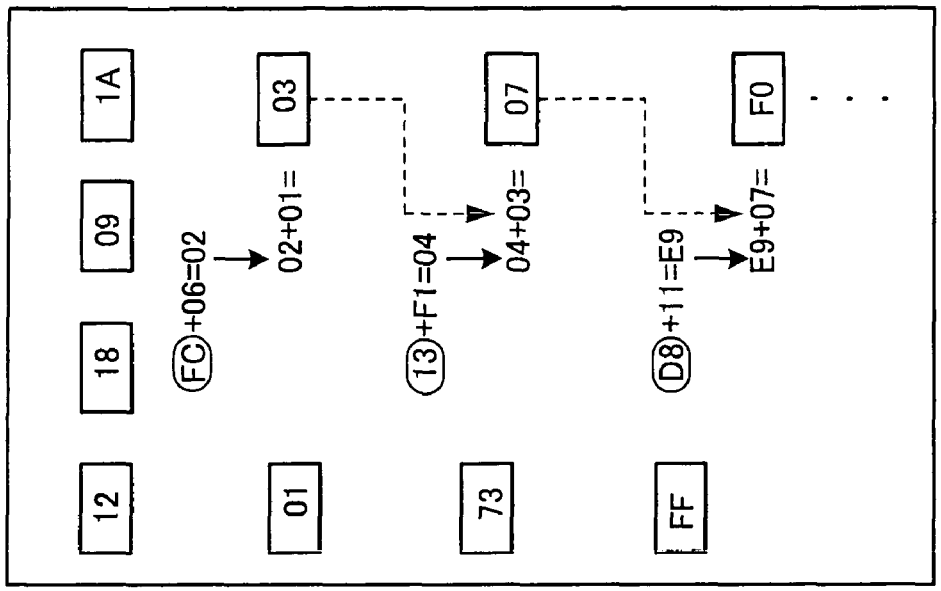
FIGS. 7A and 7B are views useful for understanding an example of a two-dimensional differential coding processing in the differential coding section 510 constituting the data compression apparatus 500 shown in FIG. 3.
Figure 7A:
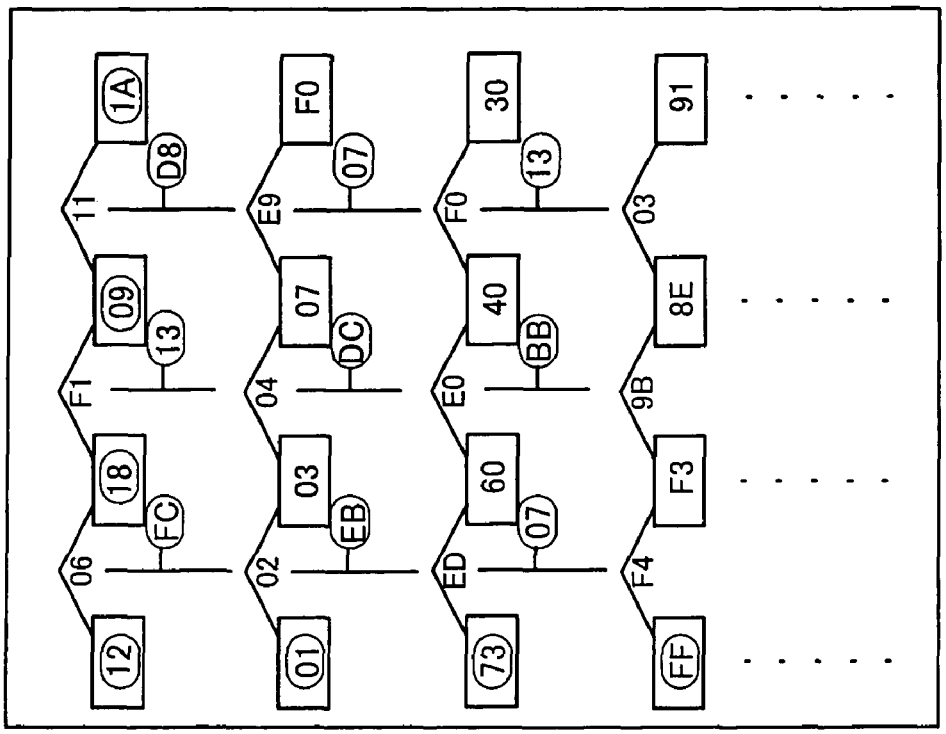

FIG. 7 is a view useful for understanding an example of the two-dimensional differential coding processing in the differential coding section 510 constituting the data compression apparatus 500 shown in FIG. 3.

Of the numerical values shown in part (A) of FIG. 7, the numerical values "12, 18, 09, . . . 01, 03, 07, F0 . . . ", which are encircled with a square, denote pixel values constituting the image data, and the numerical values "12, 18, 09, 1A . . . 01, FC, 15, D8 . . . ", which are encircled with a circle, denote output values to be outputted through the two-dimensional differential coding processing. In the following explanation, the pixels arranged in the main scanning direction (the horizontal direction of the figure) are addressed as a "line".

In the two-dimensional differential coding processing, first, with respect to the pixel values "12, 18, 09, 1A . . . " on the first line, those values are outputted directly without any processing. And differences "18−12=06", "09−18=F1", . . . between the individual adjacent pixel values in the main scanning direction are computed. For example, a result of the subtraction of "09"–"18" is the negative number, and it is expressed by "1F1" in 9 bits. Here, "1", which is one bit of the MSB (Most Significant Bit), is omitted, and only "F1", which is 8 bits in the lower order of unit bit, is outputted.

Next, with respect to the second line, only the first pixel value "01" is outputted as it is, and differences "03–01=02", "07–03=04", . . . between the individual adjacent pixel values in the main scanning direction are computed. Further individual differences between the differences "06, EF, 11 . . . " on the first line and the differences "02, 04, E9 . . . " on the second line are determined in form of "02–06=FC", "04–EF= 13", . . . , and then outputted.

Next, with respect to the third line too, processing is carried out in a similar fashion to that of the second line. That is, only the first pixel value "73" on the third line is outputted as it is, and differences "60–73=ED", "40–60=ED", . . . between the individual adjacent pixel values in the main scanning direction are computed. Further individual differences between the differences "02, 04, E9 . . . " on the second line and the differences "ED, E0, F0 . . . " on the third line are determined in form of "ED–02=EB", "E4–04=DC", . . . , and then outputted.

This operation is repeated to output the numerical values encircled in FIG. 7, as set forth below.

"12 18 09 1A . . . 01 FC 15 D8 . . . 73 EB DC 07 . . . FF 07 BB 13 . . . "

To decode the differential encoded data as mentioned above, the interface equipment 200 shown in FIG. 1 performs an operation as shown in the right side (a part (B)) of FIG. 7.

First, individual pixel values "12 18 09 1A . . . " on the first line are left as it is.

Individual first pixel values "01" "73" "FF" . . . on each line of the second line and those following are left as it is.

Here, by way of example, the second and those following differentials "FC 15 D8 . . . " on the second line are raised and there will be explained, a procedure of decoding the original pixel values from the differentials.

In order to perform decoding of the pixel values, there are used three pixel values, as to the object pixel, for three pixels of a pixel on the preceding position (the left side of the figure) on the associated line, a pixel on the same position on the preceding line (the upper side of the figure), and a pixel on the preceding position of the preceding line.

With respect to the differential "FC" of the second pixel on the second line, there are used the pixel value "12" of the first pixel on the first line, the pixel value "18" of the second pixel on the first line, and the pixel value "01" of the first pixel on the second line to determine the difference between the pixel value "18" of the second pixel on the first line and the pixel value "12" of the first pixel on the first line, that is, "18– 12=06". The difference "06" is added to the differential "FC" of the object to obtain a result. Thus, there is obtained "02" which is expressed with 8 bits in the lower order of unit bit, of the result. The pixel value "01" of the first pixel on the second line is added to the value "02" to obtain a result. Thus, "03", which is expressed with 8 bits in the lower order of unit bit, of the result, is decoded in form of the second pixel value on the second line.

With respect to the third pixel value on the second line, the difference "09–18=F1" between the third pixel value and the second pixel value on the first line is added to the differential value "13" to obtain a result. Thus, there is obtained "04", which is expressed with 8 bits in the lower order of unit bit, of the result. Further, the second pixel value "03" on the second line is added to the value "04" to obtain a result. Thus, the third pixel value on the second line is "07", which is expressed with 8 bits in the lower order of unit bit, of the result.

With respect to the fourth pixel value on the second line, the difference "1A–09=11" between the fourth pixel value and the third pixel value on the first line is added to the differential value "D8" to obtain a result. Thus, there is obtained "E9", which is expressed with 8 bits in the lower order of unit bit, of the result. Further, the third pixel value "07" on the second line is added to the value "E9" to obtain a result. Thus, the fourth pixel value on the second line is "F0", which is expressed with 8 bits in the lower order of unit bit, of the result.

Hereinafter, this operation is repeated to decode the differential values to the pixel values before the two-dimensional differential encoding.

Such a two-dimensional differential encoding is performed on a common basis for image data of every color of red (R), green (G) and blues (B). However, the processing after the two-dimensional differential encoding is different between the image data of green (G) and the image data of the remaining red (R) and blue (B) as explained in FIG. 3.

In the following, it first explains the processing of image data green (G), and it explains the processing of the image data of each color of red (R) and blue (B) afterwards.

Data obtained through the two-dimensional differential encoding is fed to determine occurrence frequency (histogram) of all of the numerical values appearing in the image data, and then fed to the offset section 520 of FIG. 3 so that a predetermined offset value is added to the individual numerical values of the data.

With respect to effects of the two-dimensional differential encoding and the offset, it will be explained, by way of example, using image data of CT, hereinafter.

Figure 8A:
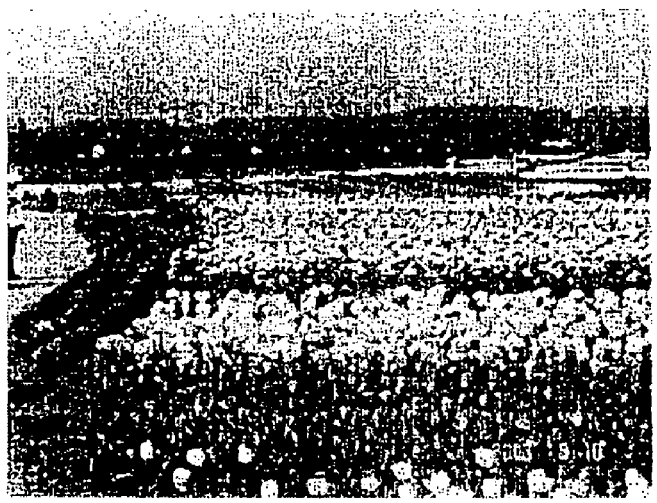
FIGS. 8A and 8B are explanatory view useful for understanding an example of image data of CT.
Figure 8B:
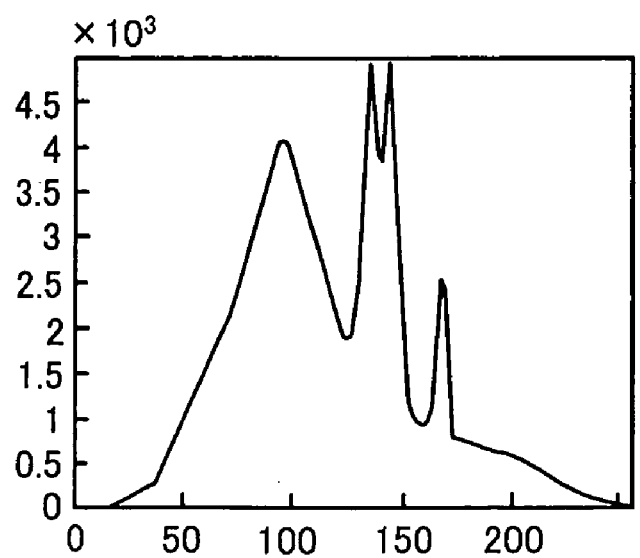

FIG. 8 is an explanatory view useful for understanding an example of image data of CT.

A part (A) of FIG. 8 shows a landscape image of color by way of an example of CT image represented by image data of CT. The CT image is represented by image data of red (R), green (G) and blues (B), which are represented by 8 bits of numerical values in color density in pixels associated with individual colors of red (R), green (G) and blues (B) of the CT image. A part (B) of FIG. 8 shows a histogram of data values in the image data of green (G), of the image data of red (R), green (G) and blues (B). The horizontal axis of the histogram denotes data values. The vertical axis of the histogram denotes data number (the number of pixels). As will be seen from the histogram, the width of the histogram is wide, and even if ups and downs on the data number occur in the histogram, an area of the data number "0" does not occur in the histogram. This property is common for the image data of red (R), green (G) and blues (B). Regarding the CT image, generally, the histogram is wide in width, and even if ups and downs on the data number occur in the histogram, it is extremely rare that an area of the data number "0" occurs in the histogram.

Figure 9A:
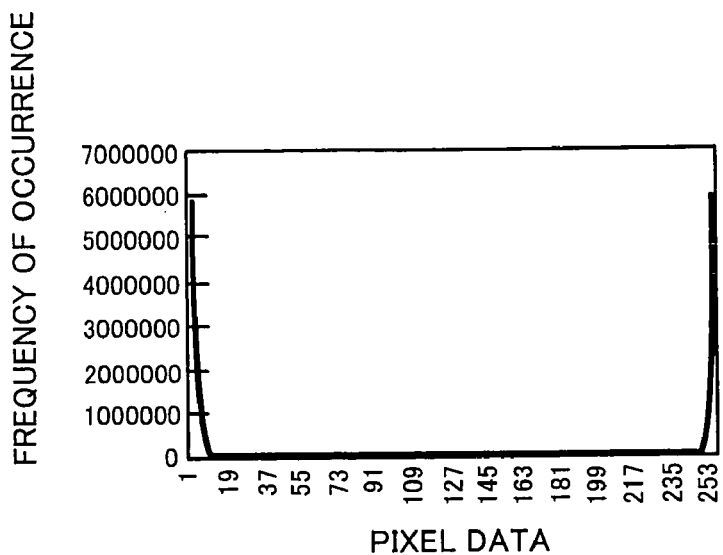
FIGS. 9A and 9B are views useful for understanding effects of the two-dimensional differential coding and offset to image data of green (G).
Figure 9B:
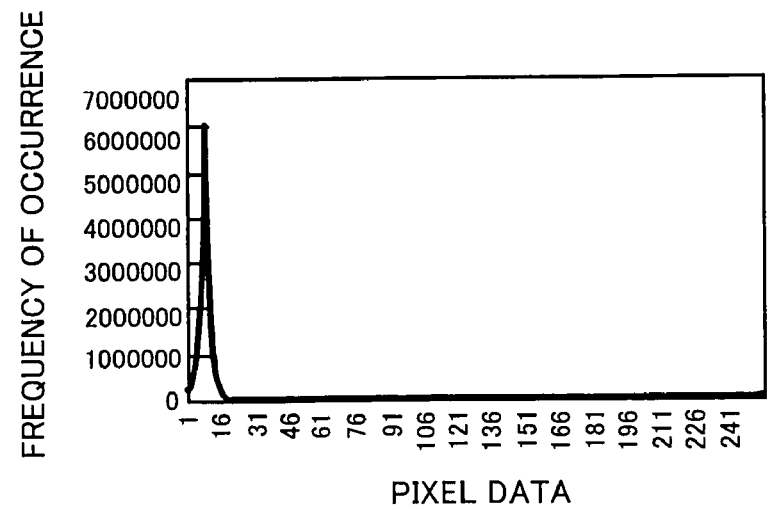

FIG. 9 is a view useful for understanding effects of the two-dimensional differential coding and offset to image data of green (G).

A part (A) of FIG. 9 shows a histogram of data which is obtained by means of applying the two-dimensional differential coding to the image data of green (G) shown in part (B) of FIG. 8. The horizontal axis of the histogram denotes data values. The vertical axis of the histogram denotes frequency of occurrence. As will be seen from the histogram, the histogram of data of the image data of green (G) subjected to the two-dimensional differential coding has sharp peaks on the minimum data value and the maximum data value. This property is common for the image data of red (R), green (G) and blues (B). When the two-dimensional differential coding, which is explained in conjunction with FIG. 7, is applied to the image data of CT, the histogram of the data generally offers a histogram having sharp peaks on both the minimum data value and the maximum data value, as shown in the part (A) of FIG. 9.

When the offset is applied to the data shown in the part (A) of FIG. 9, the histogram of the data offers a histogram having a sharp peak on the offset value, as shown in the part (B) of FIG. 9. According to the present embodiment, the offset value "8" is used, and frequency of data exceeding the value "16" as a result of the offset offers nearly "0".

Thus, the image data of green (G), which is deformed in histogram by the differential coding and the offset, is divided by the plane divisional section 530 in FIG. 3 into the lower order sub-plane and the upper order sub-plane.

Figure 10:
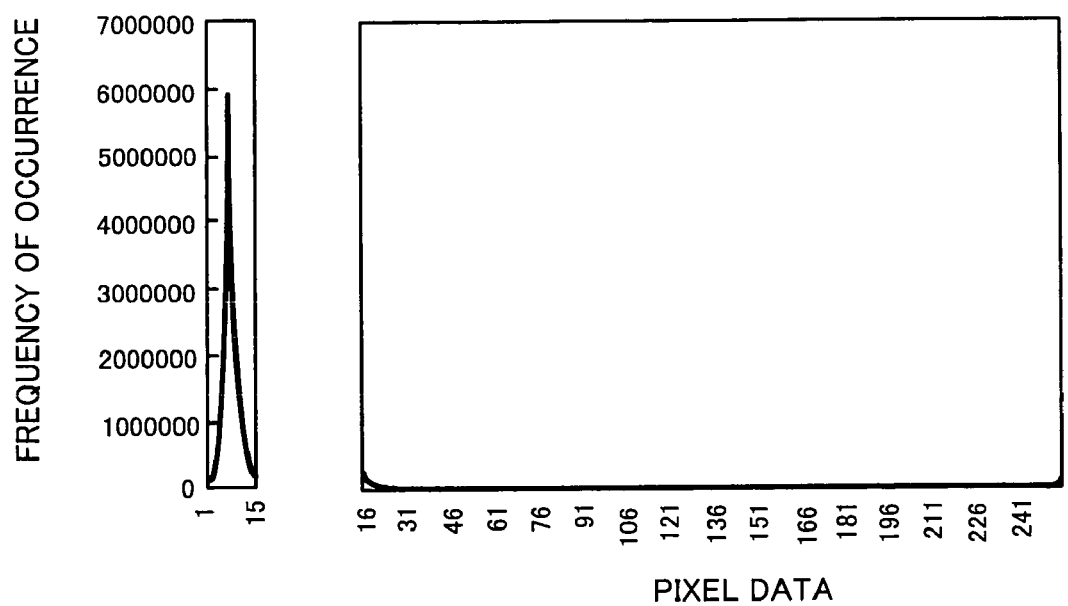
FIG. 10 is an explanatory view useful for understanding effects of data division by a plane divisional section 530.

FIG. 10 is an explanatory view useful for understanding effects of data division by the plane divisional section 530.

FIG. 10 shows a histogram in which the histogram shown in the part (B) of FIG. 9 is divided between the data value "15" and the data value "16". A data division by the plane divisional section 530 in FIG. 3 brings about an effect corresponding to the division of the histogram as mentioned above. Specifically, according to the present embodiment, a division of 8 bits of numerical values constituting the image data of green (G), which is subjected to the differential coding and the offset, into 4 bits in the upper order of unit bit and 4 bits in the lower order of unit bit makes it possible to obtain the lower order sub-plane consisting of a succession of numerical values represented by 4 bits in the lower order of unit bit and the upper order sub-plane consisting of a succession of numerical values represented by 4 bits in the upper order of unit bit. When it is interpreted that 4 bits of numerical values constituting the lower order sub-plane represent the value "0" to the value "15" as it is, and 4 bits of numerical values constituting the upper order sub-plane represent the value "16" to the value "256" at 16 intervals in 16 sorts of numerical value, the histogram of the lower order sub-plane is substantially same as the histogram shown in the left of FIG. 10, and the histogram of the upper order sub-plane is substantially same as the histogram shown in the right of FIG. 10. With respect to the histogram of the upper order sub-plane, however, it is noted that a peak of height, which is equal to an area of the histogram shown in the left of FIG. 10, is appended to a place of the data value "16" of the histogram shown in the right of FIG. 10. In view of the fact that the occurrence frequency of the pixel is almost near 0 in the histogram shown at the right of FIG. 10, it is expected that the numerical value in the upper order sub-plane involves a lot of continuousness of a value ("00", "01", and "FF" in the hexadecimal number expression) close to 0. Therefore, in order to apply the compression to the upper order sub-plane, it is effective to adopt the run length encoding in which the compression is performed in such a manner that the continuousness of the same numerical value is encoded, and thus the upper order sub-plane of image data of green (G), which is subjected to the differential coding and the offset, is fed to the run length encoding section 551 that is one of the components of the H-plain compression section 550 shown in FIG. 3.

Next, there will be explained processing for image data of green (G) after the division into the upper order sub-plane and the lower order sub-plane. First of all, there will be explained processing of the upper order sub-plane for image data of green (G).

According to the present embodiment, for the sake of convenience of processing, the run length coding section 551 deals with two sets of continued 4 bits of numerical values constituting the upper order sub-plane for image data of green (G) as a set of 8 bits of numerical values, and applies the following coding processing to a succession of numerical values from the value "00" to the value "FF" on a base of a hexadecimal number system.

According to the coding processing as mentioned above, the coding processing is carried out for only the specific numerical values of a plurality of 8 bits of numerical values. Hence, the run length coding section 551 detects, from among the received data, numerical values to be subjected to the coding processing (the numerical value is referred to as "compression object numerical value"), and the continued number of the compression object numerical value.

According to the present embodiment, it is assumed that the three numerical values of "01", "FF" and "00" may be designated as the compression subject numerical values.

FIG. 11 is an explanatory view useful for understanding coding in the run length coding section 551 shown in FIG. 3.

The upper line in FIG. 11 is concerned with data constituting the upper order sub-plane, and the lower line is concerned with data subjected to the coding processing by the run length coding section 551.

Here, as shown in the upper line of FIG. 11, it is assumed that the plane divisional section 530 receives the following data.

"06 02 02 02 01 01 01 01 04 05 00 . . . "

In this case, the run length coding section 551 in FIG. 3 detects that the first numerical value "06" is not the compression subject numerical value, the successive numerical value "02 02 02" is also not the compression subject numerical value, the compression subject numerical values "01" continuously occur four times, and the compression subject numerical values "00" continuously occur 32767 times interposing the numerical values "04" and "05", which are not the compression subject numerical values.

Figure 12:
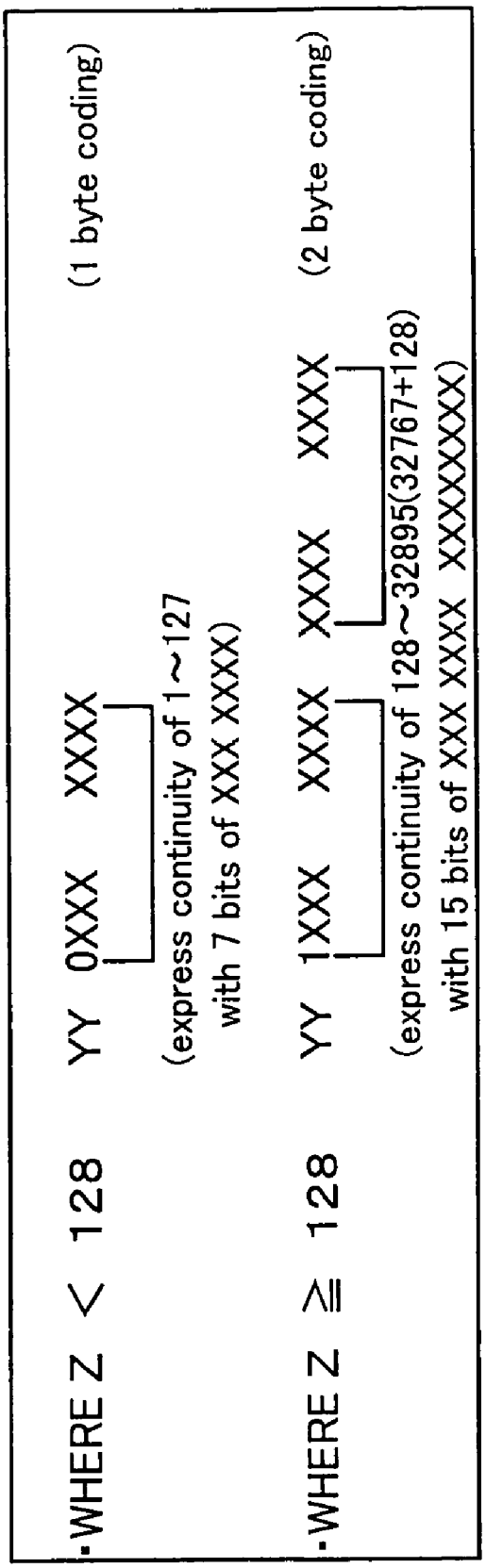
FIG. 12 is a view useful for understanding algorithm of coding for compression subject numerical values in the run length coding section.

FIG. 12 is a view useful for understanding algorithm of coding for compression subject numerical values in the run length coding section.

In FIG. 12, Z denotes a continued number of the same compression subject numerical value, for example, with respect to "01" on the upper line in FIG. 11, Z=4, and with respect to "00", Z=32767.

In FIG. 12, "YY" denotes the compression subject numerical value expressed by the hexadecimal two digits per se. "0" or "1" subsequent to "YY" denotes "0" or "1" expressed with 1 bit, respectively. "XXX XXXX . . . " denotes the value of Z, where one "X" represents 1 bit.

More in detail, in FIG. 12, in the event that the compression subject numerical value "YY" continues Z<128, the compression subject numerical value "YY" is expressed with the first one byte, the first bit is expressed by "0" with the subsequent one byte, and the value of Z is expressed with the subsequent 7 bits. And in the event that the compression subject numerical value "YY" continues Z≧128, the compression subject numerical value "YY" is expressed with the first one byte, the first bit of the subsequent 2 bytes (16 bits) is expressed by "1", so that the coding is expressed with 2 bytes, and the value of Z is expressed with the subsequent 15 bits.

Hereinafter, there will be explained an example of the coding shown in FIG. 11 in accordance with the rule shown in FIG. 12.

Since the first numerical value "06", which constitutes the data of the upper order sub-plane for image data of green (G) (on the upper line) received from the plane divisional section 530 in FIG. 3, is not the compression subject numerical value, the value "06" is directly outputted. Further, since the subsequent numerical values "02 02 02" are also not the compression subject numerical value, those three values "02" are also directly outputted. Next, since four pieces of compression subject numerical value "01" continue, the values are coded into "01 04". Since the subsequent numerical values "04 05" are not the compression subject numerical value, those values "04" and "05" are directly outputted.

Next, since 32767 pieces of numerical value "00" continue, "00" is established, and the first one bit of the next one byte is expressed by "1" and 32767-128 is expressed with 15 bits, so that three bytes of "00 FF 7F" express that 32767 pieces of "00" continue. That is, the continued number 128 is expressed with "00 00", except for the first bit "1".

Figure 13:
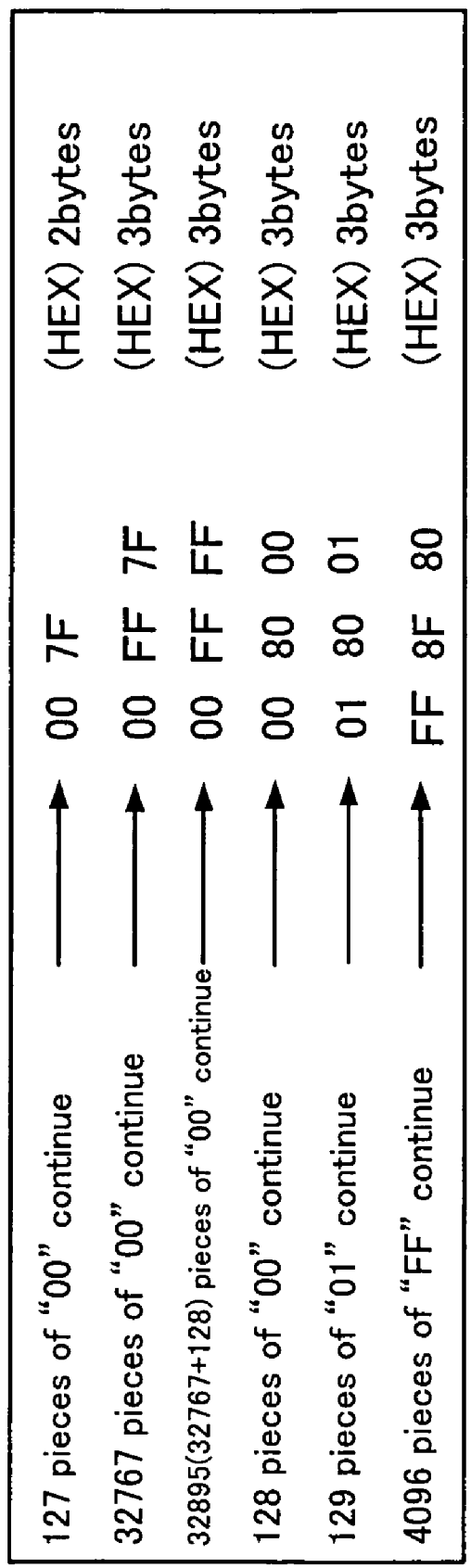
FIG. 13 is an explanatory view useful for understanding an example of the coding processing according to the continued number in the run length coding section 551 shown in FIG. 3.

FIG. 13 is an explanatory view useful for understanding an example of the coding processing according to the continued number in the run length coding section 551 shown in FIG. 3.

When 127 pieces of "00" continue, the use of 2 bytes encodes data to "00 7E".

When 32767 pieces of "00" continue, the use of 3 bytes encodes data to "00 FF 7E".

When 32895 pieces of "00" continue, the use of 3 bytes encodes data to "00 FF FF".

When 128 pieces of "00" continue, the use of 3 bytes encodes data to "00 80 00".

When 129 pieces of "01" continue, the use of 3 bytes encodes data to "01 81 00".

When 4096 pieces of "FF" continue, the use of 3 bytes encodes data to "FF 8F 80".

The run length coding section 551 shown in FIG. 3 performs the coding processing as mentioned above.

According to the run length coding section 551 of the present embodiment, the maximum bulk compressibility is improved to 3/32895=1/10965. With respect to the data of the upper order sub-plane, which is the subject of the coding processing by the run length coding section 551, as mentioned on the histogram of FIG. 10, almost all 4 bits of numerical values offer the numerical value "0" representative of the data value "16", and 8 bits of numerical values, which are generated from the above-mentioned 4 bits of numerical values, also mostly offer the numerical value "00" on a hexadecimal number system basis. Thus, the coding processing by the run length coding section 551 makes it possible to expect a drastic data compression.

The image data of green (G), which was subjected to the coding processing in the run length coding section 551 in FIG. 3, is fed to the thinning data scanning section 552 and the optimal Huffman table creating section 553_1, which constitute the H-plane compression section 550.

The thinning data scanning section 552 first performs the thinning for data outputted from the run length coding section 551 and scans the thinned data to determine frequency of occurrence of the data value. The optimal Huffman table creating section 553_1 creates a Huffman table optimized to the entered image data of green (G) in accordance with the frequency of occurrence of the data value, which is determined in the thinning data scanning section 552. The Huffman coding section 553 performs Huffman coding in accordance with the optimized Huffman table. Here, a detailed explanation of the generation of the optimized Huffman table will be described later, and first, the concept of the Huffman table will be described.

FIG. 14 is a view useful for understanding an association between codes and numerical values in the Huffman table.

Here, the frequency of occurrence of the pixel value "A1" is highest, and "A2", "A3", "A4" . . . are higher in the named order. Incidentally, "A1" "A2", "A3", "A4" . . . do not represent directly the numerical value, and are codes each representative of the numerical value. That is, "A1" denotes, for example, the numerical value "00", and "A2" denotes, for example, the numerical value "FF". Further, according to the present embodiment, for the purpose of simplification, it is assumed that all pixels of data, which is transmitted from the run length coding section 551 in FIG. 3, are represented by anyone of 16 pieces of numerical values "A1" to "A16". There is created the Huffman table in such a manner that codes are assigned to those 16 pieces of numerical values in accordance with the frequency of occurrence of the data value. More in detail, "A1", which is highest in frequency of occurrence, is allocated "00" expressed with 2 bits. "A2" is allocated "01" expressed with 2 bits. "A3" and "A4" are allocated "100" and "101", respectively, which are expressed with 3 bits. And "A5" to "A8" are allocated the associated numerical values, respectively, which are expressed with 5 bits. Hereinafter, in a similar fashion, the lower numerical values in frequency of occurrence are allocated the associated numerical values with the more number of bits, respectively.

Figure 15:
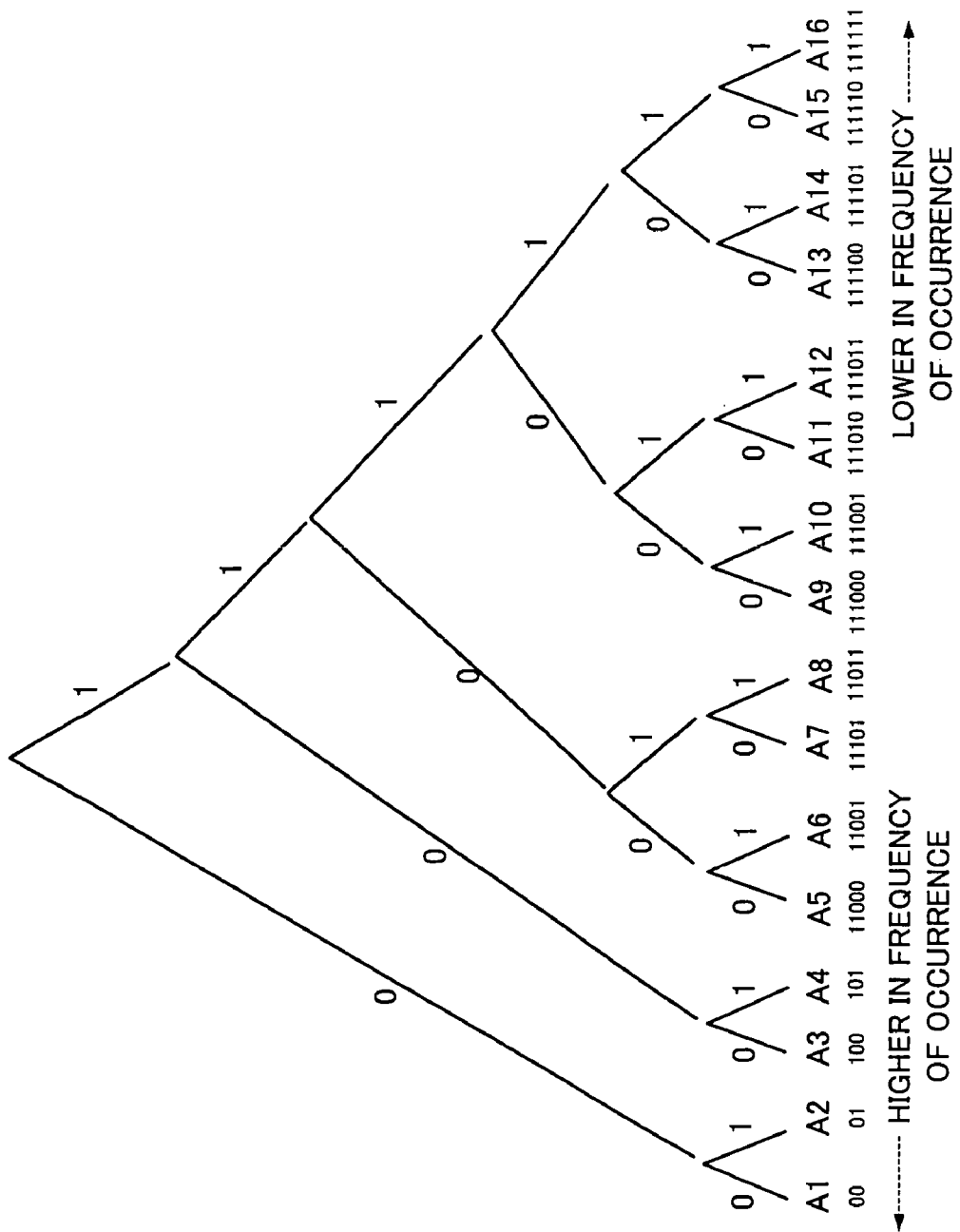
FIG. 15 is an explanatory view useful for understanding a concept of the Huffman table.

FIG. 15 is an explanatory view useful for understanding a concept of the Huffman table.

The Huffman table is harmonized with FIG. 14. That is, the Huffman table is a table that indicates an association between numerical values before coding (before replacement) and numerical values after coding (after replacement) so that data is replaced by numerical values expressed with the shorter number of bits, the higher the frequency of occurrence is concerned.

In the Huffman coding section 553, which constitutes the H-plane compression section 550 of FIG. 3, numerical values of data, which constitutes the upper order sub-plane D1H, are encoded in accordance with the Huffman table, so that many numerical values are replaced by codes each short in the number of bits. Thus, it is possible to implement the data compression.

In this manner, with respect to the upper order sub-plane D1H of image data of green (G), which is fed to the H-plane compression section 550 of FIG. 3, it is subjected to the coding by the run length coding section 551 and the coding by the Huffman coding section 553. Thus, the upper order sub-plane D1H is compressed at the higher compressibility to offer the upper order compressed data D2H.

Here, there will be explained a procedure of optimizing the Huffman table for individual image data and the effect of the optimization.

The data of the upper order sub-plane D1H of image data of green (G), which is subjected to the coding processing by the run length coding section 551, is fed to the optimal Huffman table creating section 553_1 and the thinning data scanning section 552 shown in FIG. 3.

The thinning data scanning section 552 performs data thinning processing for data of the upper order sub-plane D1H of image data of green (G), which is subjected to the coding processing by the run length coding section 551. The data thinning is carried out in such a manner that a piece of pixel data is extracted from the entered data (previous state of thinning out) at every the block of pixels of a prescribed number. Thus, the feature of the distribution of the data of the previous state of thinning out is reflected enough. And, the thinning data scanning section 552 determines the occurrence frequency (histogram) of all numerical values that appear in data thinned out.

The data histogram (occurrence frequency of numerical values), which is determined by the thinning data scanning section 552, is transferred to the optimal Huffman table creating section 553_1. The optimal Huffman table creating section 553_1 prepares on the Huffman table a code train that is suitable for the feature of the distribution of the data in the data histogram.

FIG. 16 is a view useful for understanding an example of code trains prepared on the Huffman table. FIG. 17 is a view useful for understanding an example of code trains prepared on the Huffman table.

FIG. 16 shows an example wherein data especially concentrates on the peak, and FIG. 17 shows an example wherein the range of the peak is a little wide.

A numerical value of one digit appearing on the right side of "," in each code train means the bit length, and a binary code for the corresponding bit length from the left of the mark "," toward the right represents an actual code. For example, in case of the code train of FIG. 16, the first code on the left is two bits of "11", the following second code three bits of "011", the following third code three bits of "010", and the following fourth code four bits of "1010".

In case of the code train of FIG. 16, up to the third code is a very short code in three bits or less, but long code in nine bits or more since the 12th code. To the contrary, in case of the code train of FIG. 17, up to the 13th code is a short as such code in six bits or less only though a very short code in three bits or less is the first code.

The above-mentioned code trains are prepared on the data of the upper order sub-plane D1H of image data of green (G), which is subjected to the coding processing by the run length coding section 551, and is fed to the optimal Huffman table creating section 553_1, and then numerical values are assigned to the above-mentioned code trains to complete the Huffman table. The concept of the assignment of the numerical values is the same as the concept explained referring to FIG. 14, and thus the redundant explanation will be omitted.

Because the creation of the Huffman table by the optimal Huffman table creating section 553_1 is based on the thinning out data whose volume of data is smaller than former data, it will be executed in a short time.

The Huffman table, which is created by the optimal Huffman table creating section 553_1, is transferred to the Huffman coding section 553 to perform the Huffman coding in the manner as mentioned above.

Figure 18A:
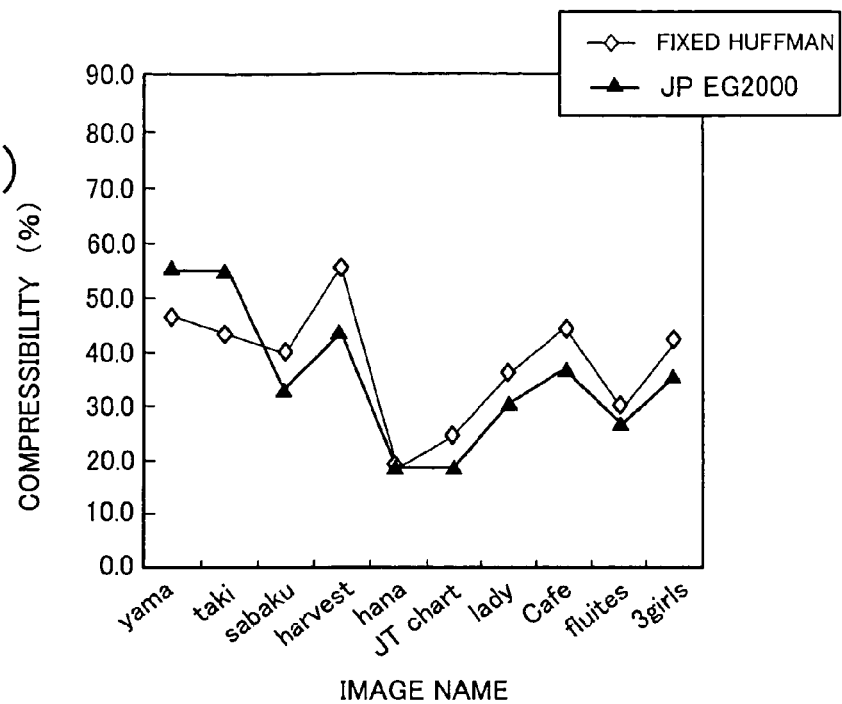
FIGS. 18A and 18B are views useful for understanding effects of the data compression brought about by the use of optimized Huffman table.
Figure 18B:
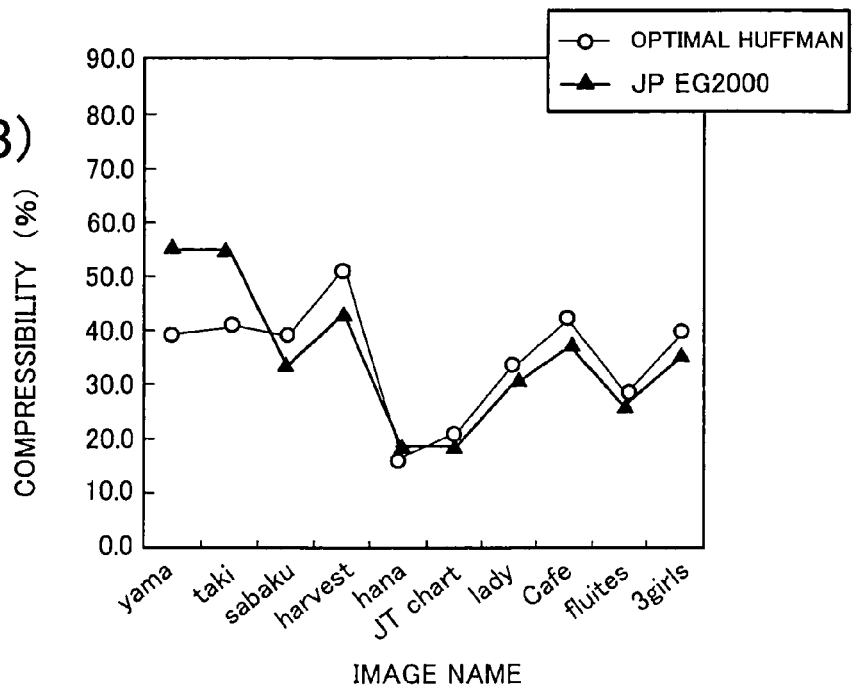

FIG. 18 is a view useful for understanding effects of the data compression brought about by the use of optimized Huffman table.

FIG. 18 shows the compressibility to the data of ten kinds of typical CT images, and also shows the compressibility by JPEG2000 of the reversible compression system known as a compression system in which an especially high compressibility is obtained among the conventional compression technologies for the comparison. A part (A) of FIG. 18 shows the compressibility where the code train shown in FIG. 16 is used on a fixing basis. A part (B) of FIG. 18 shows the compressibility where the code train suitable for individual image data is used. The compressibility is expressed at the rate at which former data is assumed to be 100%, and a so-called "High compressibility" means that the numerical value of the compressibility is small.

As shown in the part (A) of FIG. 18, in the event that the code train is used on a fixing basis, the difference of about 5%-10% remains though it considerably approaches the compressibility by JPEG2000. To the contrary, in the event that the code train suitable for individual image data is used, as shown in the part (B) of FIG. 18, it approaches even extent with inferiority hardly for the compressibility by JPEG2000, and a high compressibility has been achieved in spite of the reversible compression. Accordingly, when the H-plane compression section 550 of FIG. 3 performs the Huffman coding in accordance with the optimized Huffman table, it is possible to perform the high data compression.

Next, there will be explained processing for the lower order sub-plane of image data of green (G), which is fed to the L-plane compression section 540 of FIG. 3.

Also in the L-plane compression section 540 of FIG. 3, in a similar fashion to that of the run length coding section 551 of the H-plane compression section 550, the input data is processed in such a way that two of the numerical values in four bits are regarded as one eight bits of numerical value. The L-plane compression section 540 also comprises the optimal Huffman table creating section 541_1, the thinning data scanning section 541_2, and the Huffman coding section 541, for the purpose of performing the Huffman coding. When a user instructs a normal mode in which the Huffman coding is applied, the lower order sub-plane D1L of image data of green (G), which is fed to the L-plane compression section 540, is fed directly to the thinning data scanning section 541_2 and the optimal Huffman table creating section 541_1, without passing through the run length coding, and in a similar fashion to that of the H-plane compression section 550, it is subjected to the Huffman coding in accordance with the optimized Huffman table. As a result, the L-plane compression section 540 outputs data, which is subjected to the Huffman coding, in the form of the lower order sub-plane D2L of image data of green (G). On the other hand, in the event that a user instructs a high speed mode in which the Huffman coding is omitted and the lower order sub-plane D1L of image data of green (G) is directly outputted, no Huffman coding is carried out, and the L-plane compression section 540 outputs the lower order sub-plane D1L of image data of green (G) in the form of the lower order sub-plane D2L of image data of green (G). The mode switching section 542 performs switching between the high speed mode and the normal mode in accordance with the user's instruction.

The above-mentioned description is concerned with the explanation for the image data of green (G). Hereinafter, there will be explained processing for the individual colors of red (R) and blue (B). In the color image, it often happens that the histogram of the image data immediately after having been subjected to the two-dimensional differential coding processing becomes a histogram that looks like about each color of a red (R), green (G) and blue (B). For instance, the part (A) of FIG. 9 shows the histogram of image data of green (G) immediately after having been subjected to the two-dimensional differential coding processing for the landscape painting of the color of part (A) of FIG. 8. Also regarding the histogram of the data value in the image data of each color of red (R) and blue (B), it becomes a histogram to behave looking like. Accordingly, with respect to the image data of the individual colors of red (R) and blue (B) which is subjected to the two-dimensional differential coding processing, the image data is represented in the form of data of further difference from the image data of green (G) based on the image data of green (G), which is subjected to the two-dimensional differential coding processing. Thus, it is expected to be converted into the data of the difference that the data value concentrates on the vicinity of the starting point further. The data, in which the data value concentrates on the vicinity of the starting point, is compressed with high compressibility by the run length coding processing and the Huffman coding processing. Thus, the data compression apparatus 500 shown in FIG. 3 performs the data compression for image data of red (R) and the image data of blue (B) upon conversion into difference data from the image data of green (G). Hereinafter, there will be explained processing for the image data of red (R) and the image data of blue (B). As mentioned above, the processing for the image data of red (R) is the substantially same as the processing for the image data of blue (B), and thus the processing for the image data of red (R) will be explained in detail.

The image data of red (R), which is subjected to the two-dimensional differential coding processing in the two-dimensional differential coding section 510R of FIG. 3, is fed to the relative differential coding section 512R, so that the relative differential coding sections 512R performs the relative differential coding processing between the image data of red (R) and the image data of red (G) immediately after the two-dimensional differential coding processing. Hereinafter, there will be explained the two-dimensional differential coding processing.

The image data of red (R), which is subjected to the two-dimensional differential coding processing in the two-dimensional differential coding section 510R, becomes data in which numerical values are arranged on a two-dimensional basis in the vertical direction and the horizontal direction, as explained in conjunction with the part (A) of FIG. 7. The image data of red (R) having such a structure is fed to the relative differential coding sections 512R shown in FIG. 3. On the other hand, the image data of green (G), which is subjected to the two-dimensional differential coding processing, has also the same structure. The image data of green (G), which is subjected to the two-dimensional differential coding processing, is fed to the offset section 520 of FIG. 3 as mentioned above and the relative differential coding sections 512R of FIG. 3 as well. And the relative differential coding sections 512R computes differences between individual numerical values constituting image data of red (R), which is subjected to the two-dimensional differential coding processing, individual numerical values constituting image data of green (G), which is subjected to the two-dimensional differential coding processing, the numerical values for green (G) being located at the same positions as the associated numerical values for red (R), respectively. Specifically, in the image data of red (R), which is subjected to the two-dimensional differential coding processing, and the image data of green (G), which is subjected to the two-dimensional differential coding processing, relative differential value $S_{n,j}$ is computed as follows.

$$S_{n,j}=R_{n,j}-G_{n,j}$$

where $R_{n,j}$ and $G_{n,j}$ denote two-dimensional differential values located at nth position in the vertical direction and jth position in the horizontal direction, respectively. Accordingly, there is created data of difference in which the thus computed relative differential value $S_{n,j}$ offers a numerical value located at nth position in the vertical direction and jth position in the horizontal direction.

The relative differential coding sections 512R shown in FIG. 3 performs the relative differential coding processing as mentioned above. As a result, two-dimensional difference data of red (R) is represented in form of the relative difference data to the two-dimensional difference data of green (G). The image data of red (R), which is subjected to the relative differential coding processing, is fed to the offset section 520R, so that a predetermined offset value is added to individual numerical value of the data to offer image data in which data value concentrates on the vicinity of the starting point, as shown in the part (A) of FIG. 9.

In order to explain the effect the relative differential coding processing as mentioned above, the histogram, where the offset is directly carried out for the two-dimensional difference data of red (R), will be compared with the histogram, where the offset is carried out after the relative differential coding processing is applied to the two-dimensional difference data of red (R) hereinafter.

Figure 19:
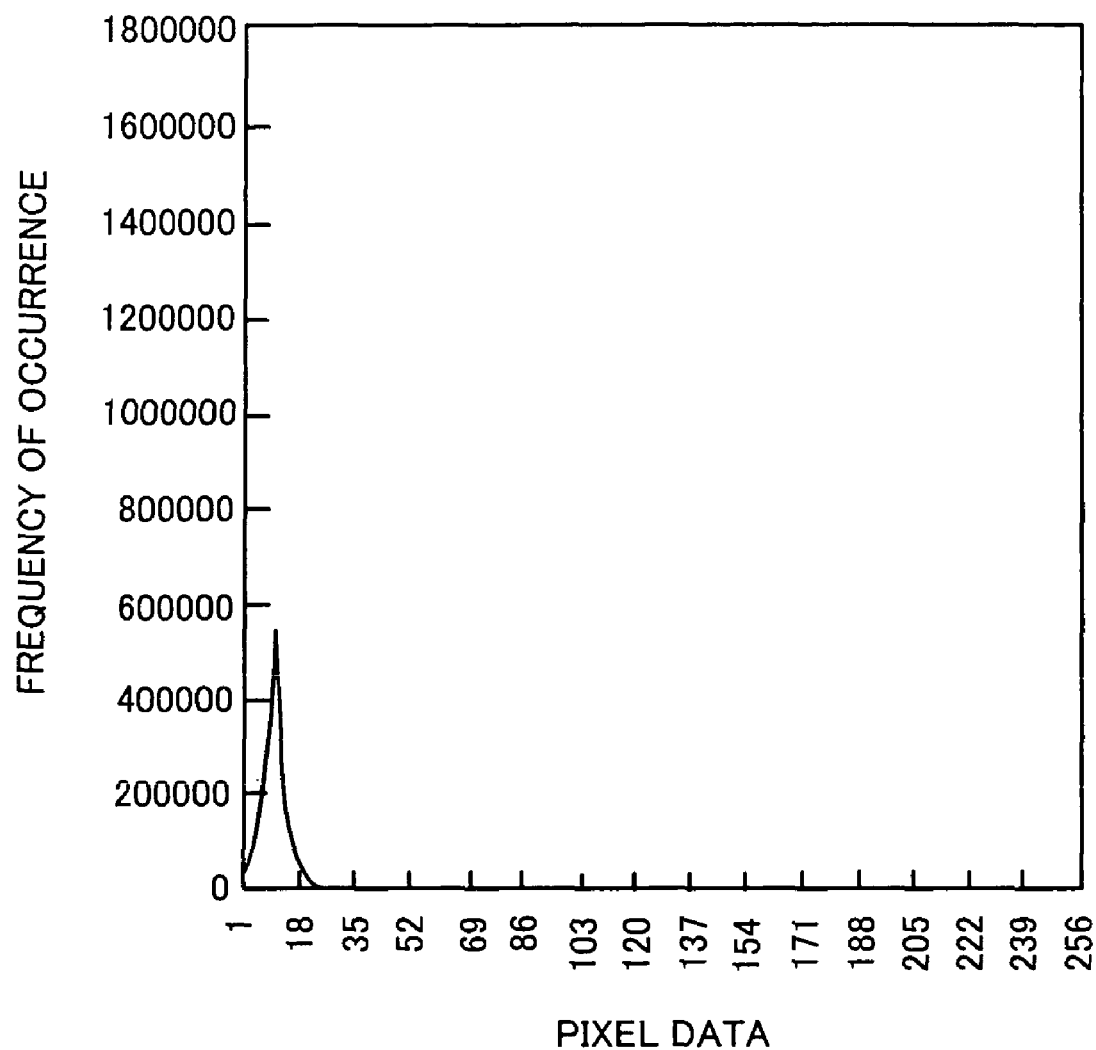
FIG. 19 is a view useful for understanding histogram where an offset is carried out for the two-dimensional differential data of red (R).
Figure 20:
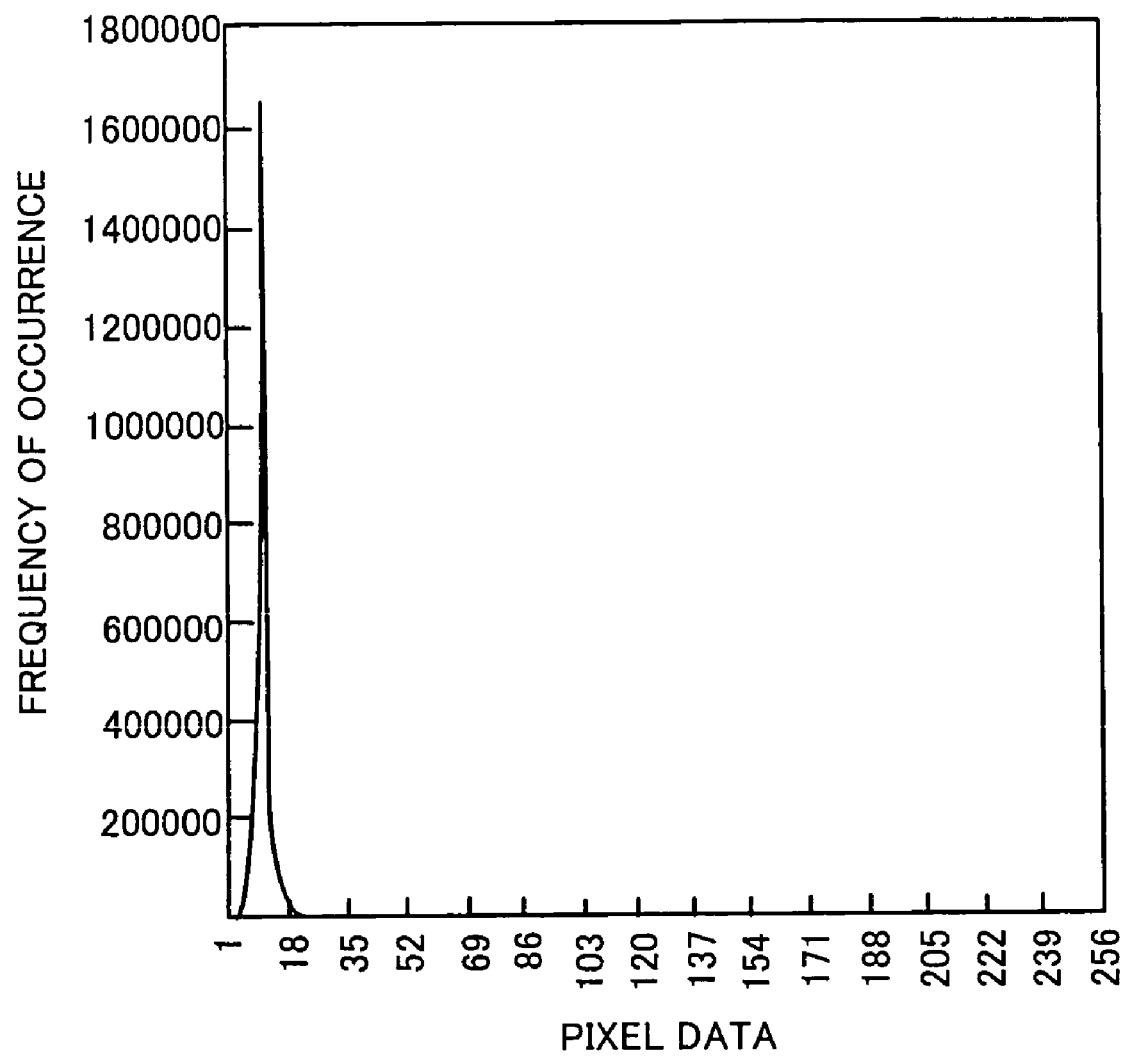
FIG. 20 is a view useful for understanding histogram where an offset is carried out after the relative differential coding is performed for the two-dimensional differential data of red (R).

FIG. 19 is a view useful for understanding histogram where an offset is carried out for the two-dimensional differential data of red (R). FIG. 20 is a view useful for understanding histogram where an offset is carried out after the relative differential coding is performed for the two-dimensional differential data of red (R).

In the comparison of the histogram of FIG. 19 with the histogram of FIG. 20, it is understood that the histogram of FIG. 20 is narrower in distribution width of the occurrence frequency than the histogram of FIG. 19, and higher in peak of the occurrence frequency. Accordingly, the histogram of FIG. 20 is higher in degree that the occurrence frequency concentrates on the vicinity of the starting point as compared with the histogram of FIG. 19. Accordingly, it is expected that the data after the relative differential coding described in the histogram of FIG. 20 is extremely higher in the compressibility when compressed by the run length coding processing and the Huffman coding processing, as compared with the data that is not subjected to the relative differential coding, as described in the histogram of FIG. 19.

The plane division section 530R divides the image data of red (R), which is subjected to the relative differential coding processing and the offset in the relative differential coding sections 512R of FIG. 3 and the offset section 520R, into the lower order sub-plane D1L_R of image data of red (R), which consists of the continuousness of the lower order bits of numerical value, and upper order sub-plane D1H_R of image data of red (R), which consists of the continuousness of the upper order bits of numerical value. The lower order sub-plane D1L_R of image data of red (R) is fed to the L-plane compression section 540R to apply the reversible compression processing that is the same as processing applied to the lower order sub-plane D1L of image data of green (G), and is outputted from the L-plane compression section 540R in the form of the lower order compressed data D2L of red (R). On the other hand, the upper order sub-plane D1H_R of image data of red (R) is fed to the H-plane compression section 550R to apply the reversible compression processing that is the same as processing applied to the upper order sub-plane D1H of image data of green (G), and is outputted from the H-plane compression section 550R in the form of the upper order compressed data D2H_R of red (R).

Regarding processing for the image data of blue (B), the same processing as the image data of red (R) is carried out as mentioned above, and the processed data are outputted from the L-plane compression section 540B and the H-plane compression section 550B in the form of the lower order compressed data D2L_B of blue (B) and the upper order compressed data D2H_B of green (B), respectively.

When the compressed image data of red (R) and image data of blue (B) are decoded, those data are once decoded into the two-dimensional differential data of red (R) and the two-dimensional differential data of green (G), and the two-dimensional differential data of red (B) and the two-dimensional differential data of green (G), respectively, and then the decoded two-dimensional differential data of red (R) and the two-dimensional differential data of green (G) are decoded into the former image data of red (R) and the former image data of green (G), respectively, in accordance with procedure of decoding explained in conjunction with the part (B) of FIG. 7.

As mentioned above, the data compression apparatus 500 executes the reversible compression processing of the image data by using that the correlation is strong in the two-dimensional differential data of a different color, and great compression is implemented especially about the data of the CT image.

The above explanation is concerned with the present embodiment.

According to the present embodiment, the data compression is applied to only the data of the CT image of color. However, according to a data compression apparatus of the present invention, it is acceptable that the data compression is applied to data of both the CT image of color and the LW image of color. Alternatively, it is acceptable that the data compression is applied to data representative of information as to color other than images.

According to the present embodiment, in order to compress image data of individual colors of red (R), green (G), and blue (B), the compression of the image data of red (R) and blue (B) is carried out based on the image data of green (G). However, according to the present invention, it is acceptable that the compression of the image data is carried out based on the image data of any color. The present invention is applicable also in the event that other colors such as orange, as color elements, other than red (R), green (G), and blue (B), are added. Further, the present invention is not restricted to a case where the color element is a combination of red (R), green (G), and blue (B), and is applicable also in the event that the color element is a combination of for instance yellow (Y), magenta (M), cyan (C), and black (K).

When first difference data as mentioned above are generated from the color data associated with color elements mutually different in sort, it often happens that these first difference data include group of the first difference data in which the feature of the data distribution is common and the correlation is strong.

According to the data compression apparatus of the present invention as mentioned above and the associated data compression program, the second difference data is generated from the difference of the first difference data which are mutually strong in correlation, and is subjected to the compression processing. An adoption of the process of generating such the second difference data makes it possible that data to be processed in compression offers the state compressed easily, since the data to be processed becomes data that the numerical value constituting the data concentrates near the numerical value of a specific value. As a result, when the compression processing is carried out in such a way that the individual numerical values of the second difference data are divided into the upper order bit portion and the lower order bit portion as mentioned above, it is possible to achieve a large compressibility in its entirety. Further, the compression processing according to the present invention is simple in algorithm. This feature makes it possible to reduce the processing time. Specifically, it is possible to implement a preferable reversible compression processing for CT data of color which is desired to compress and reduce the amount of data.

A preparation of the first coding section of the upper order data compression section encodes only the compression subject numerical value into the numerical value representative of the compression subject numerical value and the continued number. Thus, this feature makes it possible to avoid such a situation that the compressed data increases in redundancy more than the original data, and thereby improving compressibility.

A preparation of the second coding section of the upper order data compression section makes it possible to expect further improvement of compressibility by the entropy coding (typically Huffman coding).

According to the present invention, the upper order data compression section has the histogram computing section and the code allocating section, and the second coding section uses a table allocated in codes by the code allocating section to apply the entropy coding (for example, Huffman coding). This feature makes it possible to further improve compressibility as compared with the entropy coding using a table in which an allocation of codes is fixed.

According to the present invention, the histogram computing section performs thinning of numerical values and determines a histogram in accordance with thinned out numerical values. This feature makes it possible to expect an improvement of the processing speed.

Further, according to the present invention, the lower order data compression section applies the entropy coding. This feature makes it possible to expect further improvement of compressibility by the entropy coding (typically Huffman coding).

Furthermore, according to the present invention, the lower order data compression section outputs lower order data without any compression in accordance with an instruction of compression omission. This feature makes it possible to select a higher speed of compression processing.

While the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. A data compression apparatus that applies a data compression processing to data to be compressed, which consists of two or more color data each of which is represented by a succession of numerical values represented by a predetermined number of unit bits, the two or more color data being associated with two or more sorts of color element, respectively, the data compression apparatus comprising:

a first difference creating means for determining differences between adjacent numerical values on a succession of numerical values constituting each of the two or more color data and creates two or more first difference data each of which consists of a succession of numerical values representative of the differences, the two or more first difference data being associated with the two or more sorts of color element, respectively;

a second difference creating means for determining differences between numerical values constituting one of the two or more first difference data associated with a predetermined sort of color element of the two or more sorts of color element, and numerical values constituting each of remaining first difference data of the two or more first difference data excepting the one of the two or more first difference data, and creates one or more second difference data each of which consists of a succession of numerical values representative of the differences, the one or more second difference data being associated with remaining color elements of the two or more sorts of color element excepting the predetermined sort of color element, respectively;

an offset means for offsetting, by a predetermined value, numerical values constituting individual difference data constituting a difference data group consisting of the one of the two or more first difference data associated with the predetermined sort of color element and the one or more second difference data associated with the remaining color elements, respectively;

a dividing means for dividing the individual numerical values offset in numerical value by the offset means into an upper order unit bit portion and a lower order unit bit portion at a predetermined number of divisional bits that is less than the predetermined number of unit bits, so that the individual difference data constituting the difference data group is divided into upper order data consisting of a succession of numerical values of the upper order unit bit portion and lower order data consisting of a succession of numerical values of the lower order of unit bit portion;

an upper order data compression means for applying reversible compression processing to the upper order data divided by the dividing means; and a lower order data compression means for applying the reversible compression processing to the lower order data divided by the dividing means.

2. A data compression apparatus according to claim 1, wherein the first difference creating means determines a two-dimensional difference based on a plurality of numerical values each adjacent to an associated numerical value in a plurality of directions looking on an image, on the numerical values constituting the first difference data.

3. A data compression apparatus according to claim 1, wherein the upper order data compression means comprises a first coding means for performing such coding processing that numerical values excepting one or a plurality of predetermined compression subject numerical values of the upper order data are directly outputted without any processing, and compression subject numerical values are encoded into the compression subject numerical values and numerical values indicative of a continued number of the same compression subject numerical values as the compression subject numerical values.

4. A data compression apparatus according to claim 1, wherein the upper order data compression means comprises:
a first coding means for performing such coding processing that numerical values excepting one or a plurality of predetermined compression subject numerical values of the upper order data are directly outputted without any processing, and compression subject numerical values are encoded into the compression subject numerical values and numerical values indicative of a continued number of the same compression subject numerical values as the compression subject numerical values, and a second coding means for applying entropy coding to data subjected to coding by the first coding means using a table for associating codes with numerical values.

5. A data compression apparatus according to claim 1, wherein the upper order data compression means comprises:
a first coding means for performing such coding processing that numerical values excepting one or a plurality of predetermined compression subject numerical values of the upper order data are directly outputted without any processing, and compression subject numerical values are encoded into the compression subject numerical values and numerical values indicative of a continued number of the same compression subject numerical values as the compression subject numerical values, and a second coding means that applies Huffman coding to data subjected to coding by the first coding means using a Huffman table.

6. A data compression apparatus according to claim 1, wherein the upper order data compression means comprises:
a first coding means for performing such coding processing that numerical values excepting one or a plurality of predetermined compression subject numerical values of the upper order data are directly outputted without any processing, and compression subject numerical values are encoded into the compression subject numerical values and numerical values indicative of a continued number of the same compression subject numerical values as the compression subject numerical values;

a histogram computing means for determining a histogram of numerical values appearing on data subjected to coding by the first coding section;

a code allocating means for allocating shorter codes in code length as higher numerical values in frequency of occurrence to a table for associating codes with numerical values in accordance with the histogram determined in the histogram computing means; and a second coding means for applying entropy coding to data subjected to coding by the first coding means using the table subjected to a code allocation by the code allocating means.

7. A data compression apparatus according to claim 6, wherein the histogram computing means performs a thinning for numerical values appearing on data subjected to coding by the first coding means and determines the histogram according to the thinned numerical values.

8. A data compression apparatus according to claim 1 wherein the lower order data compression means applies entropy coding to the lower order data using a table for associating codes with numerical values.

9. A data compression apparatus according to claim 1, wherein the lower order data compression means applies Huffman coding to the lower order data using a Huffman table.

10. A data compression apparatus according to claim 1, wherein the lower order data compression means outputs the lower order data with non-compression in accordance with an instruction of compression omission.

11. A non-transitory computer-readable storage medium storing a data compression program, which causes an information processing apparatus to operate as a data compression apparatus that applies a data compression processing to data to be compressed, which consists of two or more color data each of which is represented by a succession of numerical values represented by a predetermined number of unit bits, the two or more color data being associated with two or more sorts of color element, respectively, the data compression apparatus comprising:

a first difference creating means for determining differences between adjacent numerical values on a succession of numerical values constituting each of the two or more color data and creates two or more first difference data each of which consists of a succession of numerical values representative of the differences, the two or more first difference data being associated with the two or more sorts of color element, respectively;

a second difference creating means for determining a differences between numerical values constituting one of the two or more first difference data associated with a predetermined sort of color element of the two or more sorts of color element, and numerical values constituting each of remaining first difference data of the two or more first difference data excepting the one of the two or more first difference data, and creates one or more second difference data each of which consists of a succession of numerical values representative of the differences, the one or more second difference data being associated with remaining color elements of the two or more sorts of color element excepting the predetermined sort of color element, respectively;

an offset means for offsetting, by a predetermined value, numerical values constituting individual difference data constituting a difference data group consisting of the one of the two or more first difference data associated with the predetermined sort of color element and the one or more second difference data associated with the remaining color elements, respectively;

a dividing means for dividing the individual numerical values offset in numerical value by the offset means into an upper order unit bit portion and a lower order unit bit portion at a predetermined number of divisional bits that is less than the predetermined number of unit bits, so that the individual difference data constituting the difference data group is divided into upper order data consisting of a succession of numerical values of the upper order unit bit portion and lower order data consisting of a succession of numerical values of the lower order of unit bit portion;

an upper order data compression means for applying reversible compression processing to the upper order data divided by the dividing means; and a lower order data compression means for applying the reversible compression processing to the lower order data divided by the dividing means.

* * * * *